(12) United States Patent
Fujii

(10) Patent No.: US 11,787,734 B2
(45) Date of Patent: Oct. 17, 2023

(54) COVER MEMBER

(71) Applicant: AGC INC., Tokyo (JP)

(72) Inventor: Kensuke Fujii, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 17/652,395

(22) Filed: Feb. 24, 2022

(65) Prior Publication Data

US 2022/0177365 A1 Jun. 9, 2022

Related U.S. Application Data

(63) Continuation of application No. PCT/JP2020/031348, filed on Aug. 19, 2020.

(30) Foreign Application Priority Data

Aug. 26, 2019 (JP) .................... 2019-154124

(51) Int. Cl.
| | | |
|---|---|---|
| *B32B 7/12* | (2006.01) | |
| *C03C 17/42* | (2006.01) | |
| *G02B 1/18* | (2015.01) | |
| *H05K 5/03* | (2006.01) | |

(52) U.S. Cl.
CPC ............... *C03C 17/42* (2013.01); *B32B 7/12* (2013.01); *G02B 1/18* (2015.01); *C03C 2217/213* (2013.01); *C03C 2217/76* (2013.01); *C03C 2218/119* (2013.01); *C03C 2218/156* (2013.01); *H05K 5/03* (2013.01)

(58) Field of Classification Search
CPC .......... B32B 7/12; B32B 17/06; C03C 17/42; G02B 1/14; G02B 1/16; G02B 1/18
See application file for complete search history.

(56) References Cited

U.S. PATENT DOCUMENTS

2018/0072613 A1  3/2018 Minorikawa et al.

FOREIGN PATENT DOCUMENTS

JP        2018-48061 A     3/2018

OTHER PUBLICATIONS

International Search Report dated Nov. 2, 2020 in PCT/JP2020/031348, filed on Aug. 19, 2020, 3 pages
Extended European Search Report dated Aug. 7, 2023, in corresponding European Patent Application No. 20857093.7.

*Primary Examiner* — Elizabeth E Mulvaney
(74) *Attorney, Agent, or Firm* — Oblon, McClelland, Maier & Neustadt, L.L.P.

(57) ABSTRACT

The present invention relates to a cover member including a transparent base having first and second main surfaces, an antifouling layer formed on at least a part of the first main surface, a printed layer formed on at least a part of the second main surface, and an adhered member adhered on an antifouling layer-side surface, in which when an adhered-member-contact-portion projected region is defined as a prescribed region in the second main surface, the printed layer is provided on at least a part of a near-boundary region defined as a region from a boundary of the adhered-member-contact-portion projected region to an inward at 1,000 μm from the boundary, and no printed layer is provided on at least a part of an inner region defined as a region 500 μm or more inside from the boundary of the adhered-member-contact-portion projected region.

17 Claims, 15 Drawing Sheets

[FIG. 1]
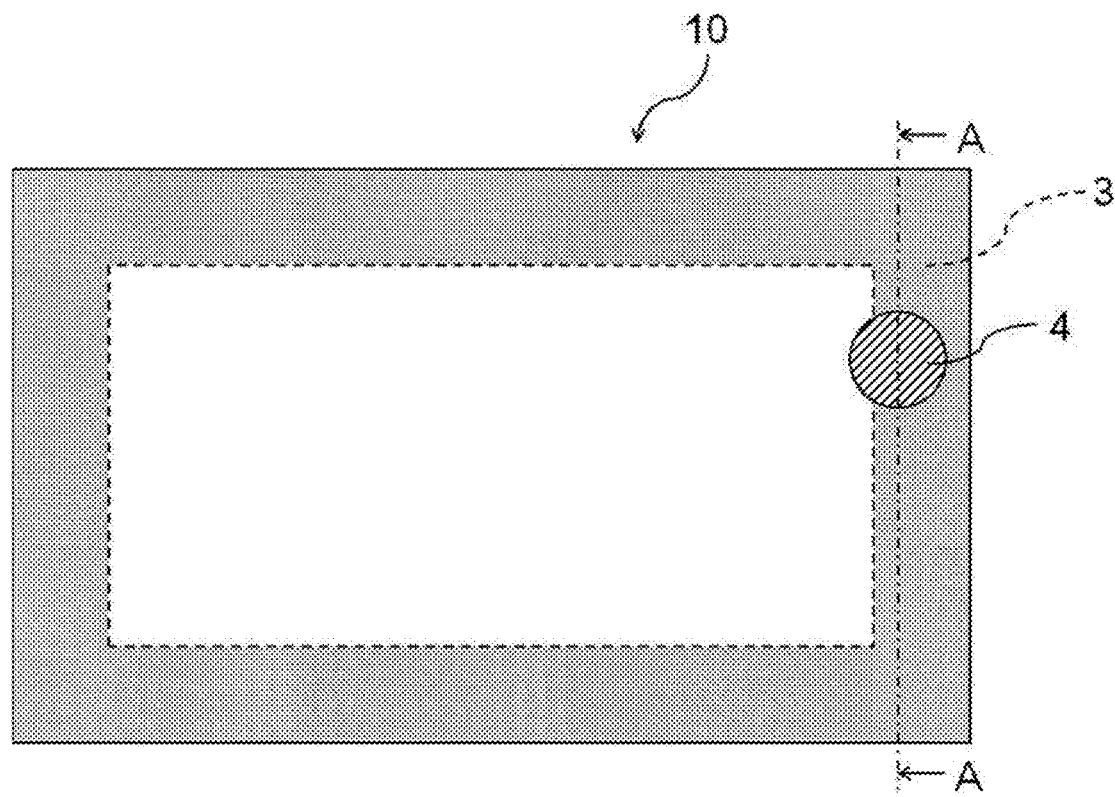
[FIG. 2]
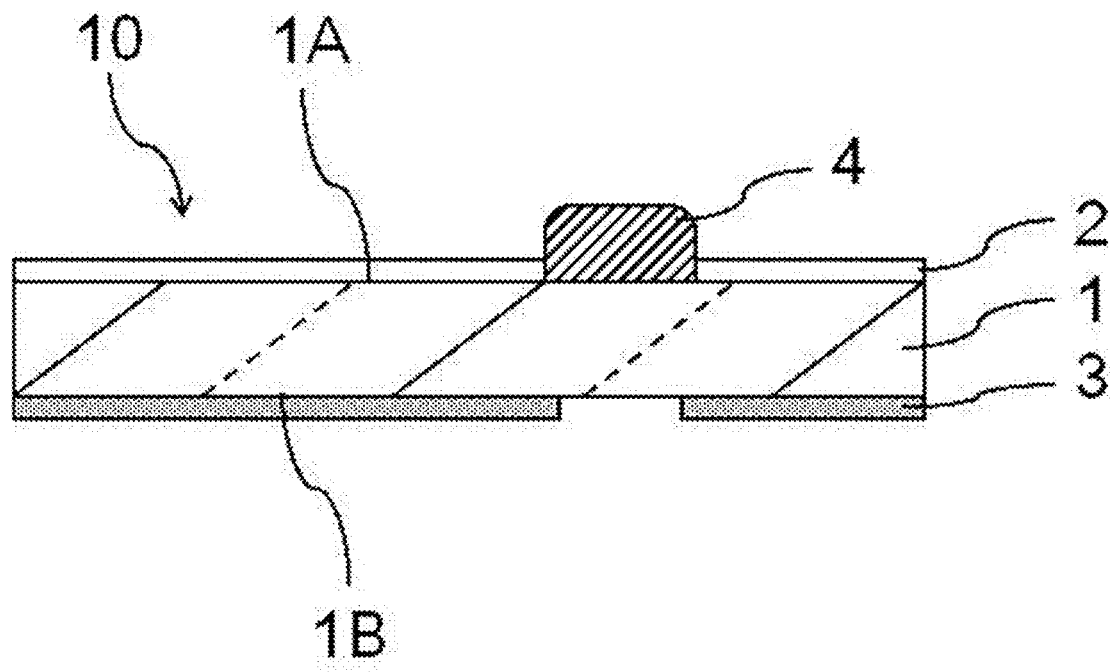

[FIG. 3]
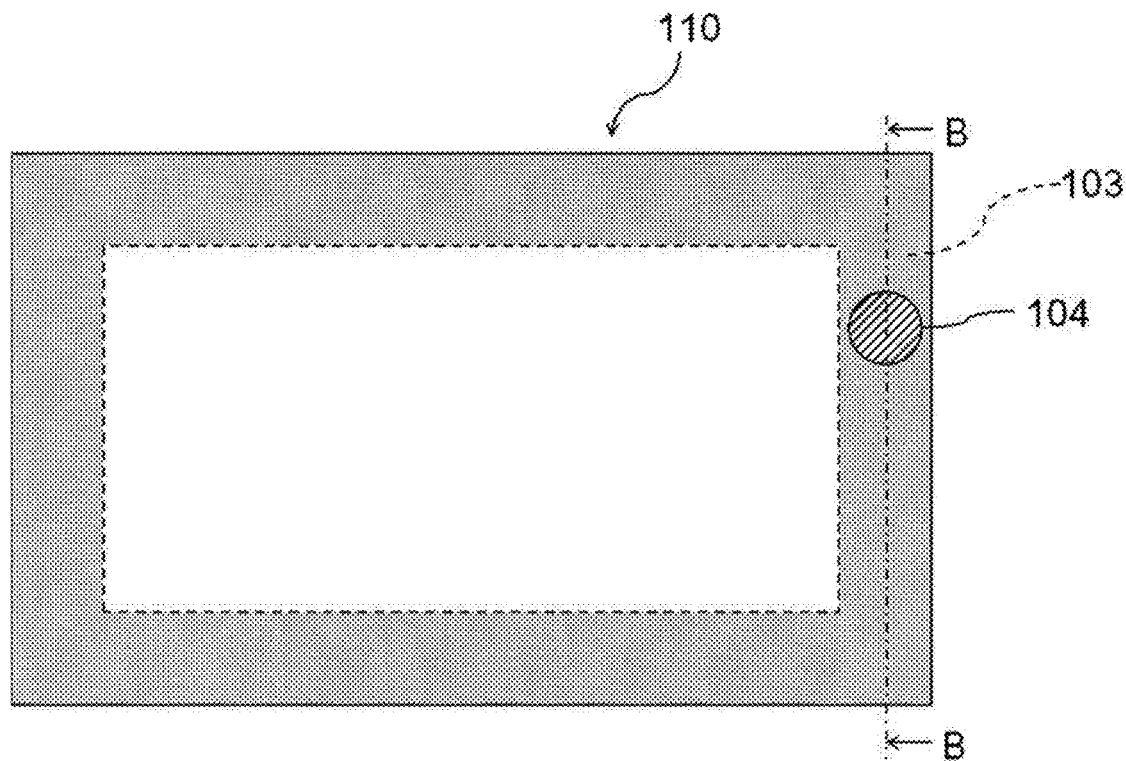
[FIG. 4]
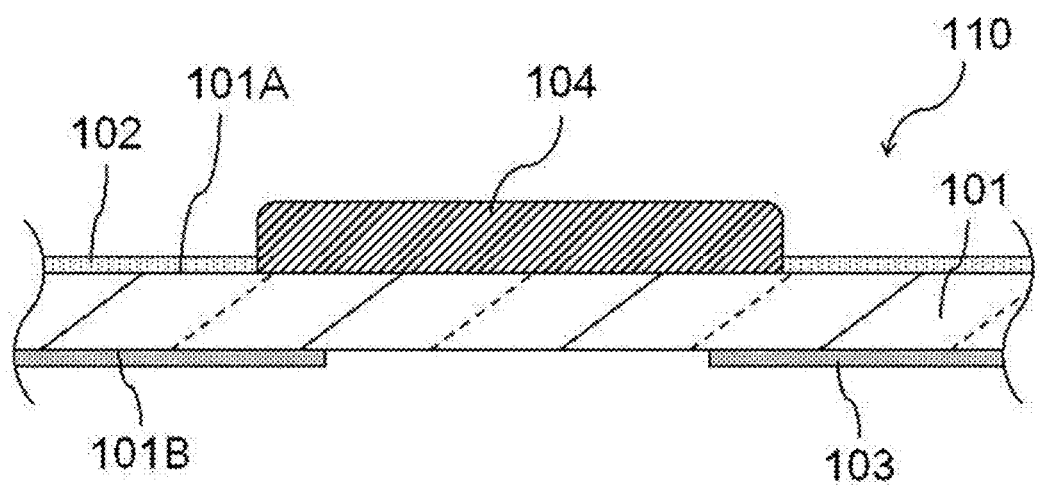

[FIG. 5]
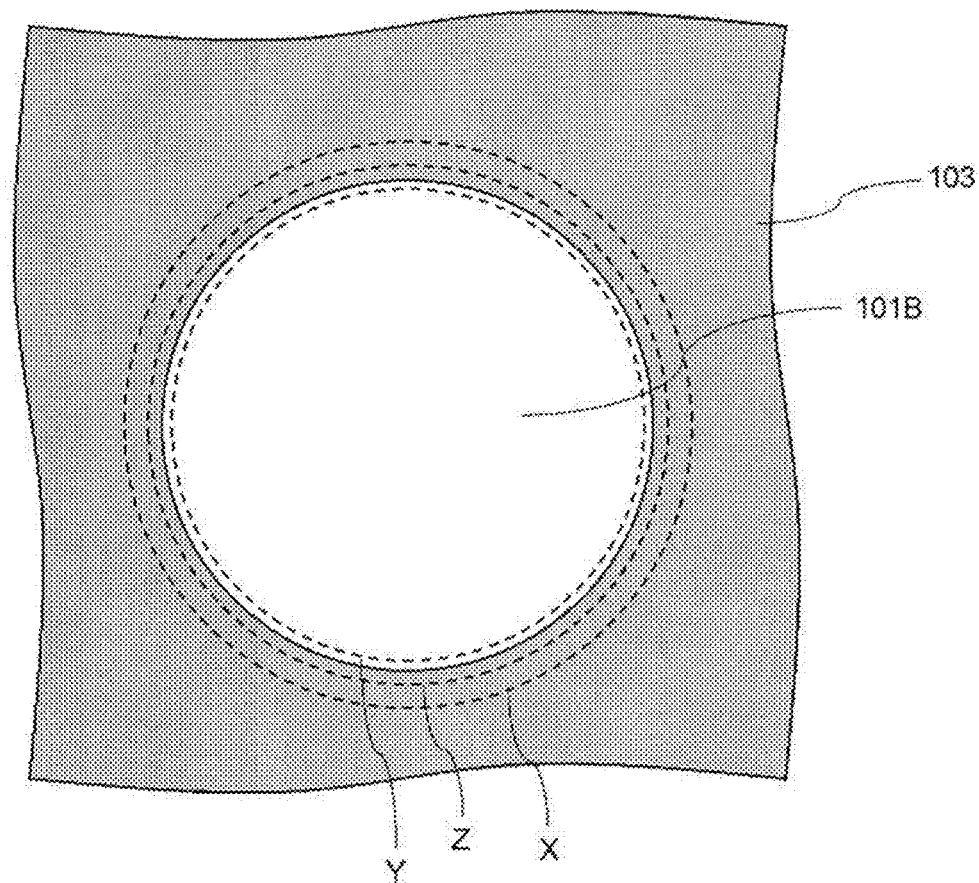
[FIG. 6]
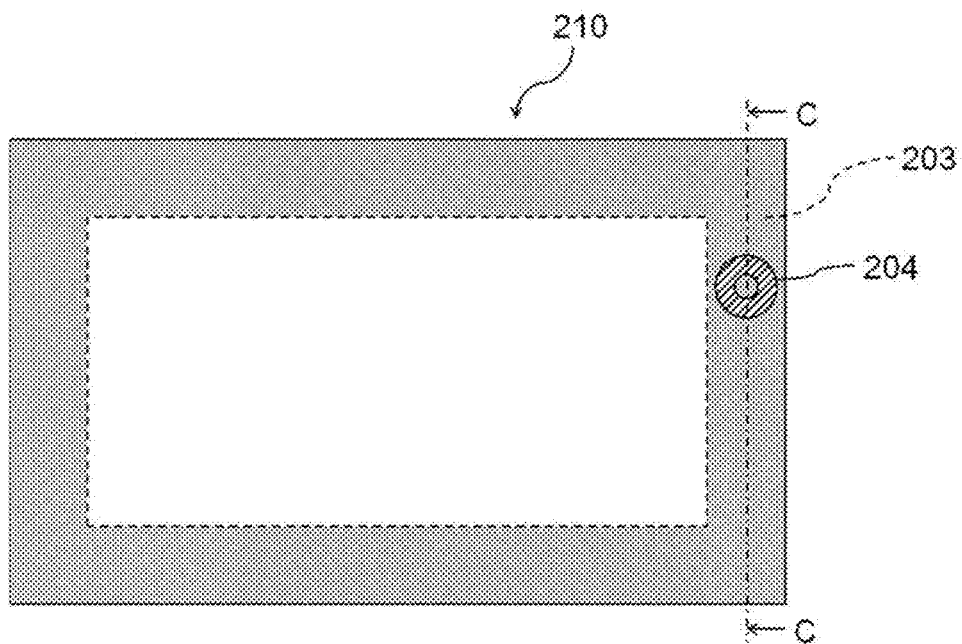

[FIG. 7]
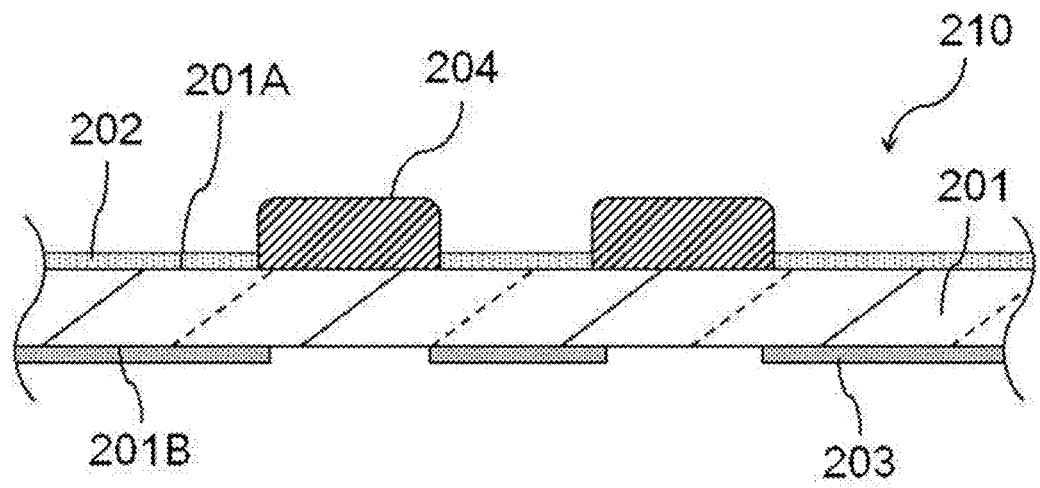
[FIG. 8]
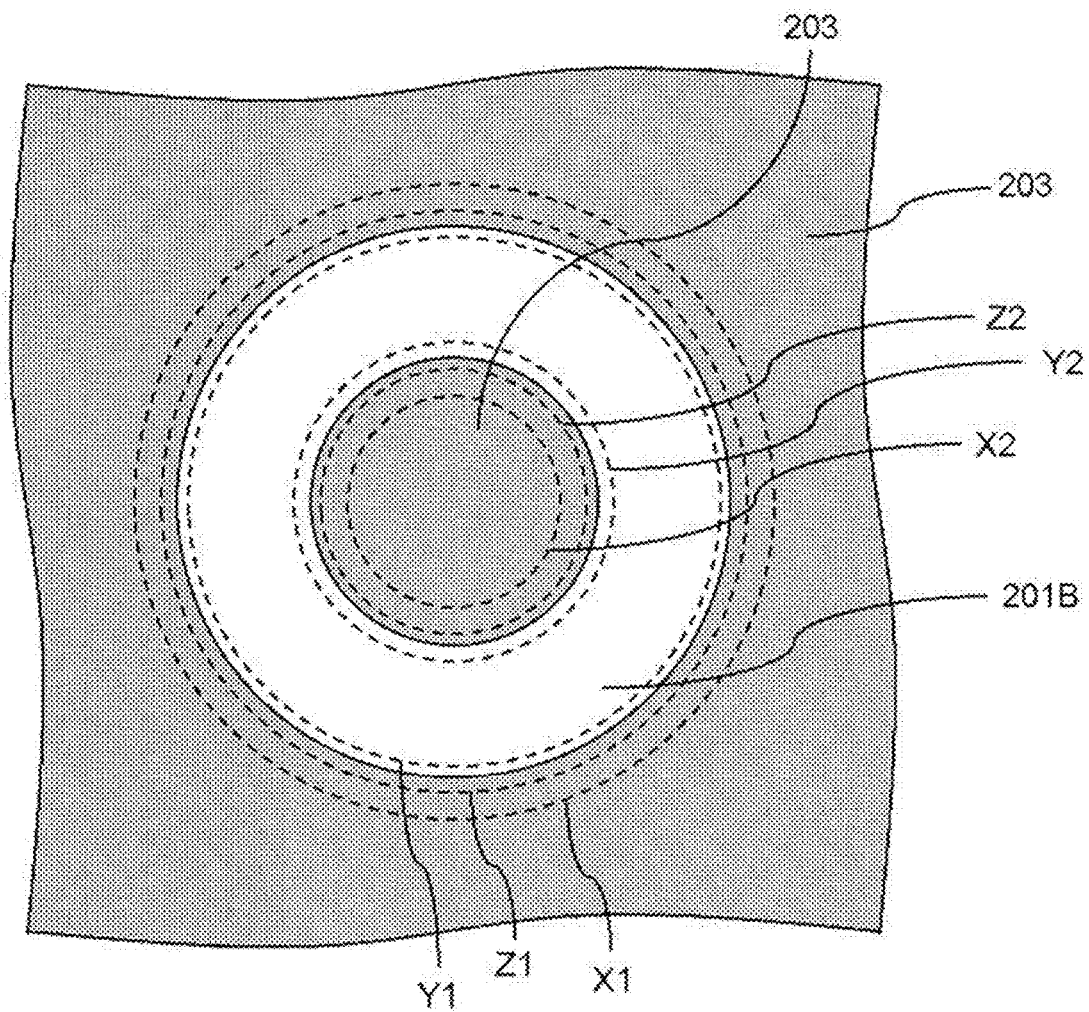

[FIG. 9]
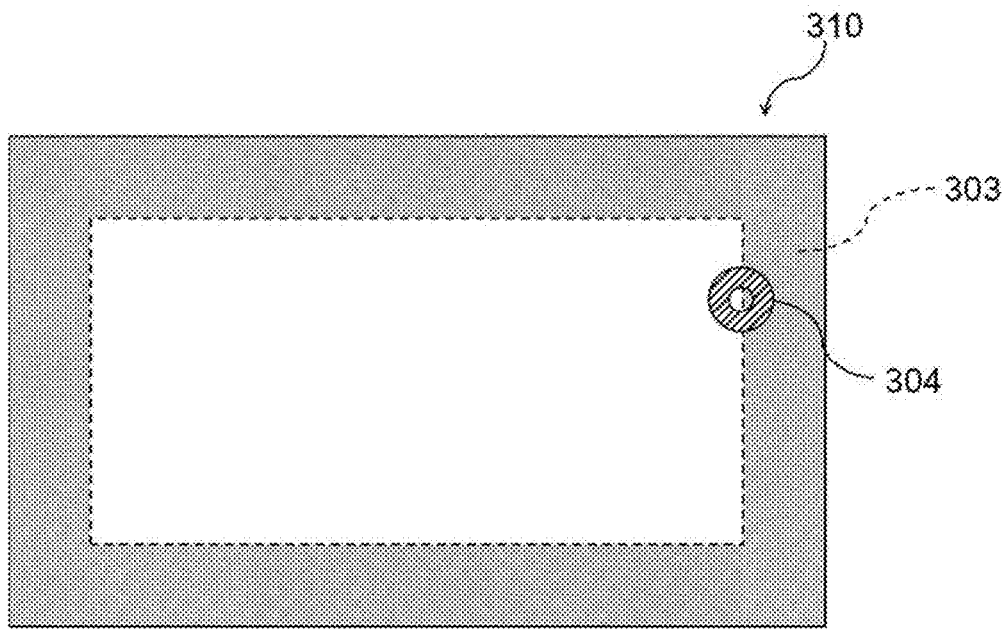
[FIG. 10]
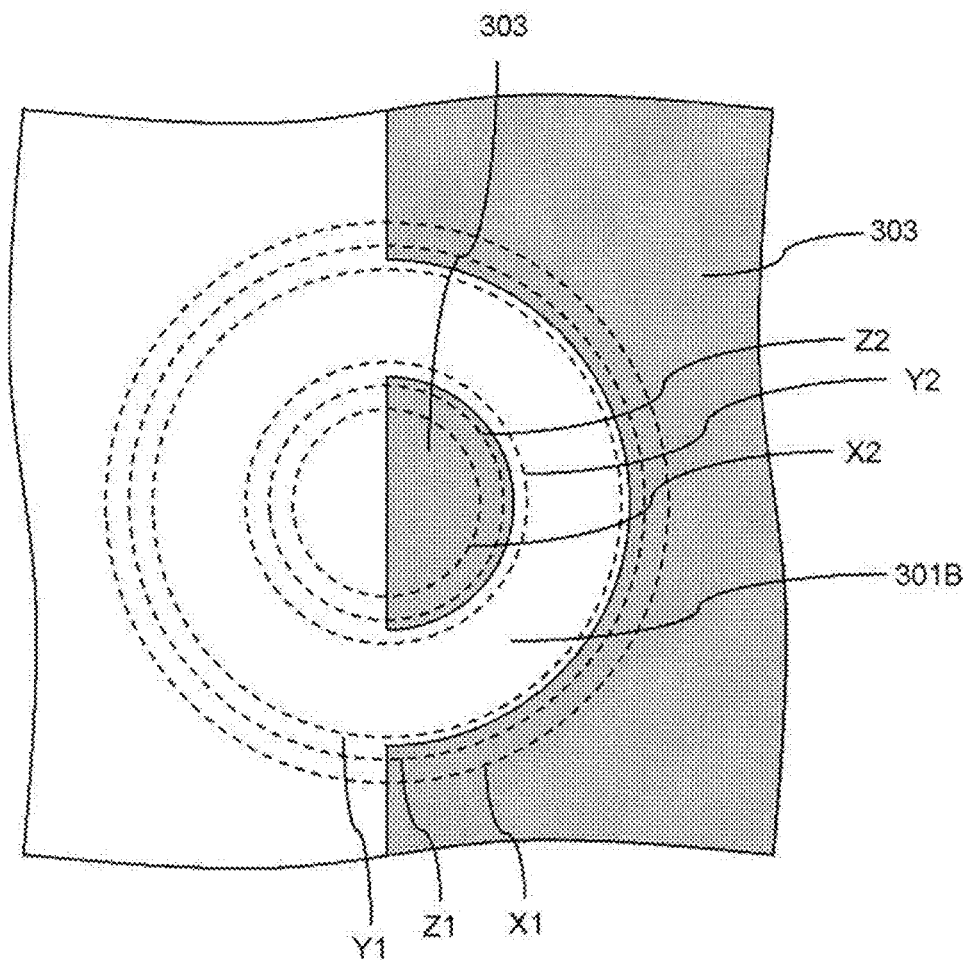

[FIG. 11]
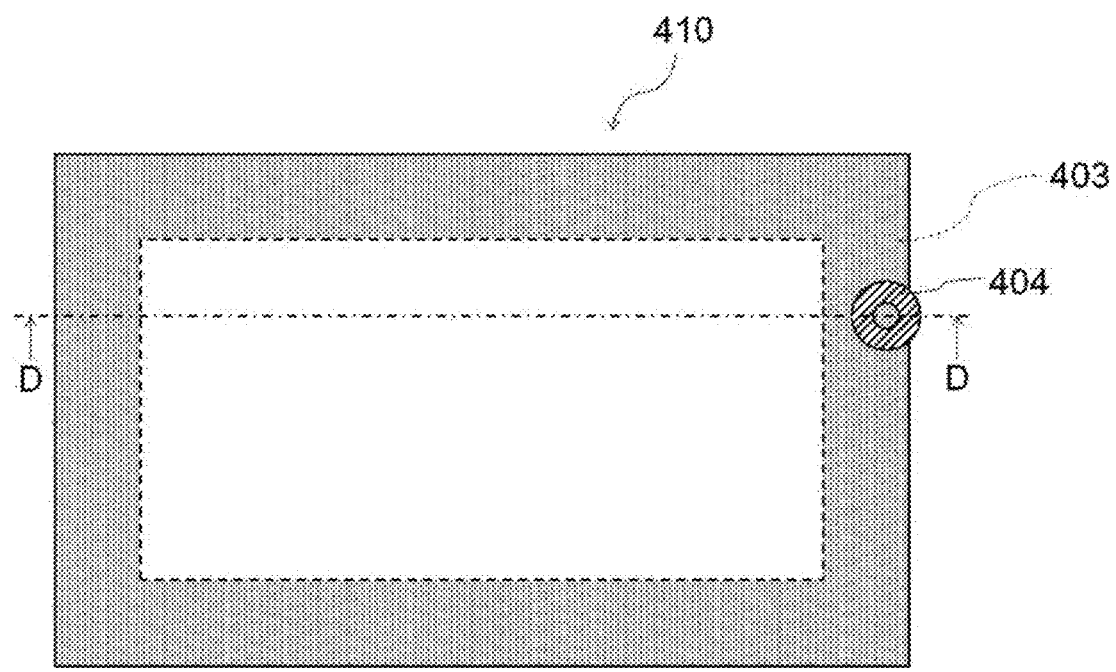
[FIG. 12]
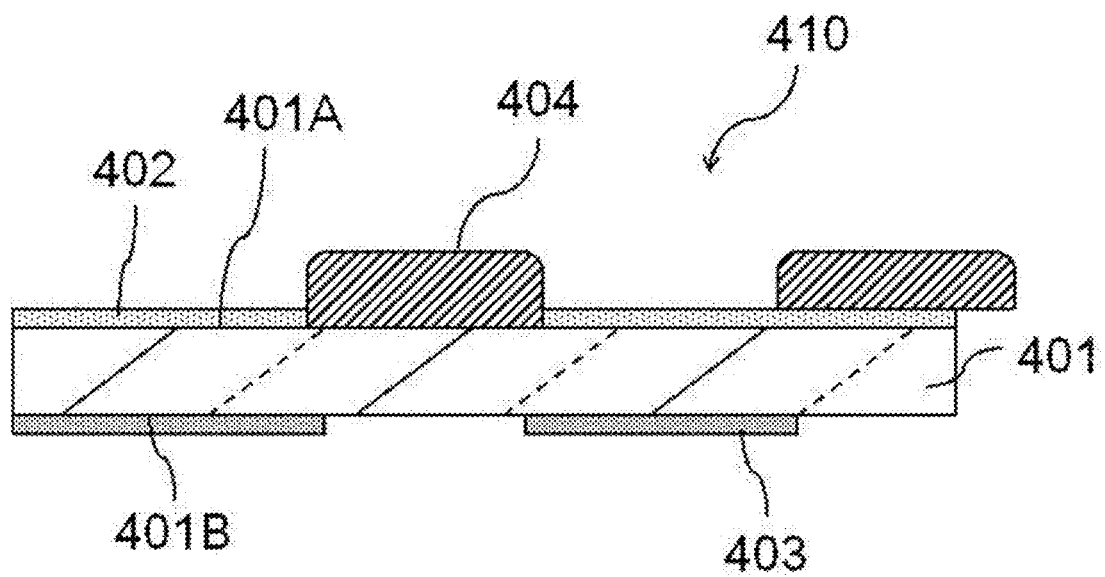

[FIG. 13]
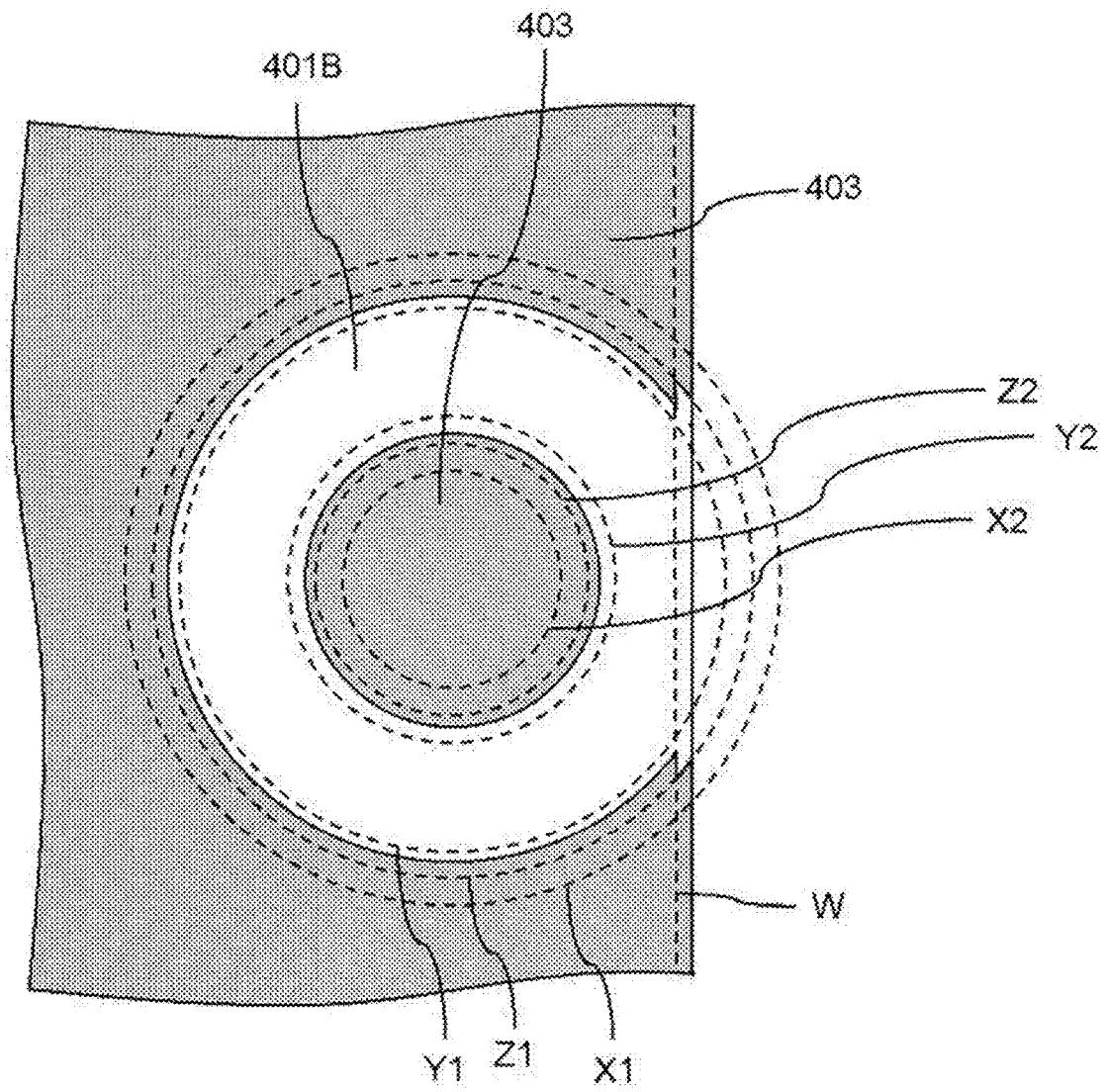

[FIG. 14]
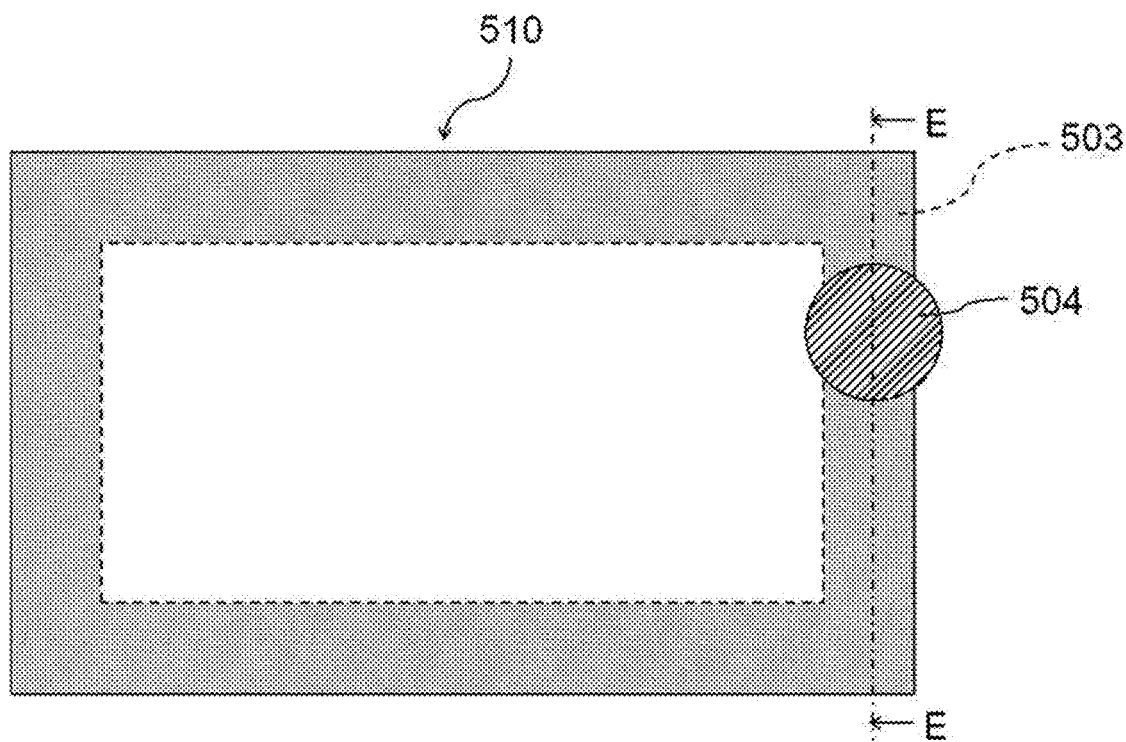
[FIG. 15]
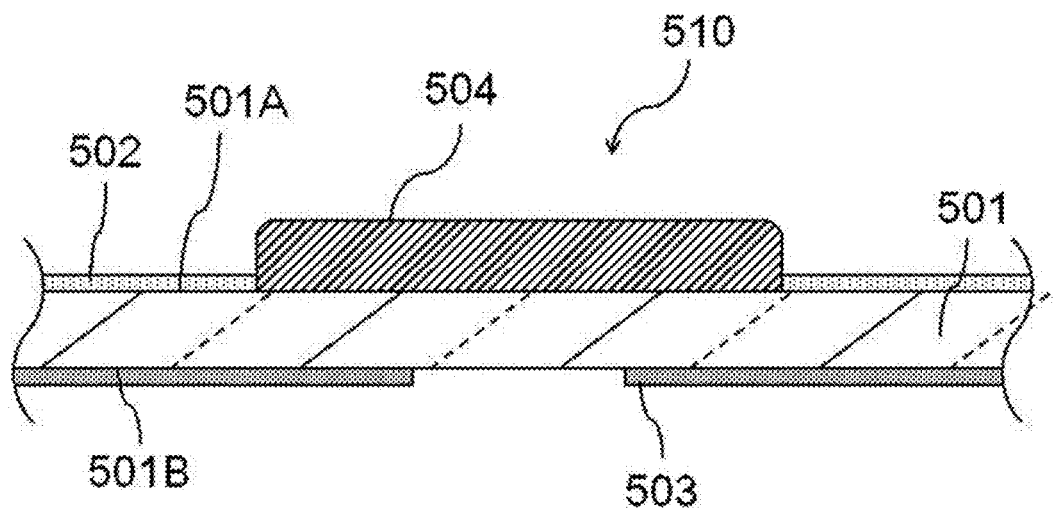

[FIG. 16]
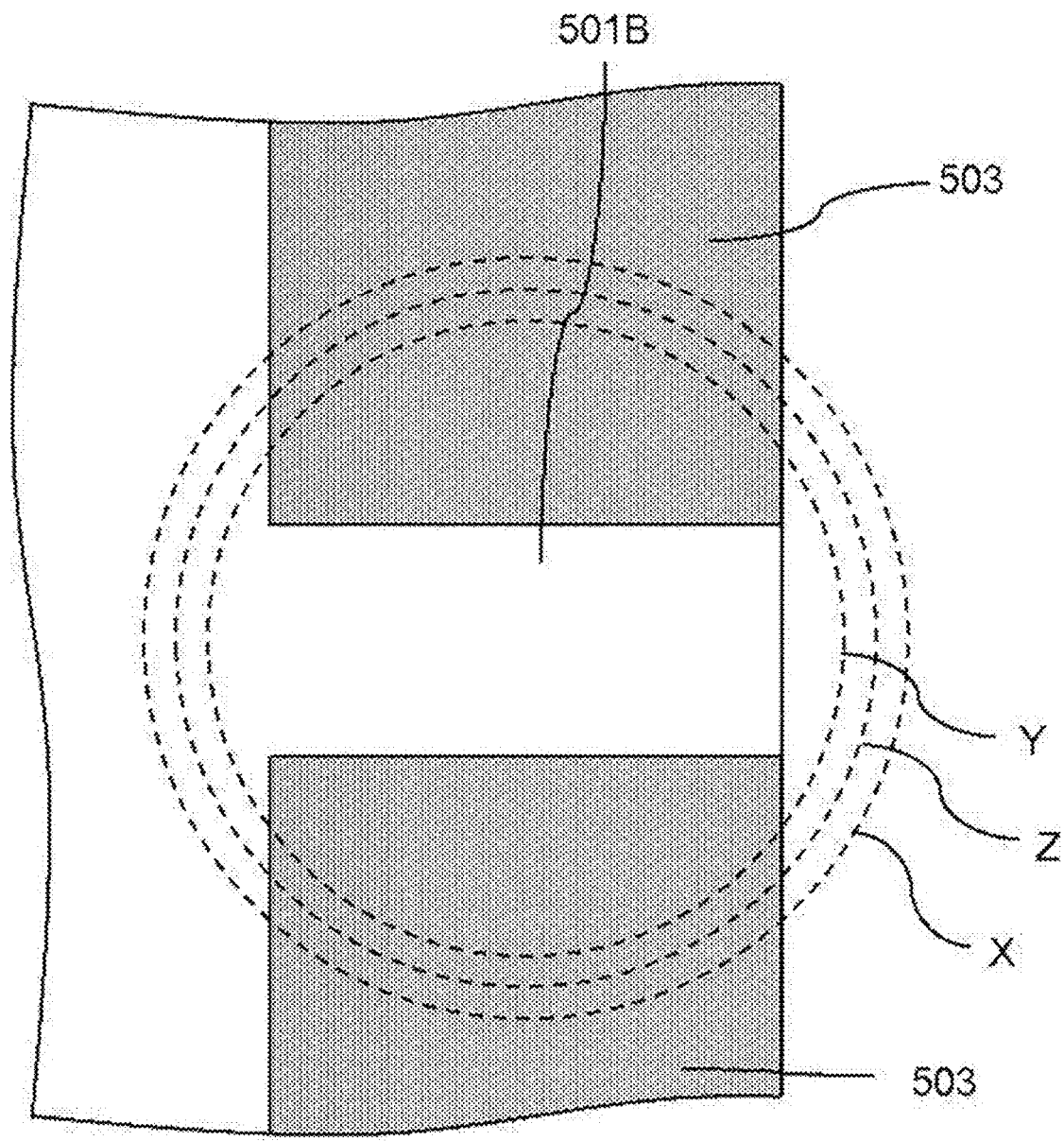

[FIG. 17]
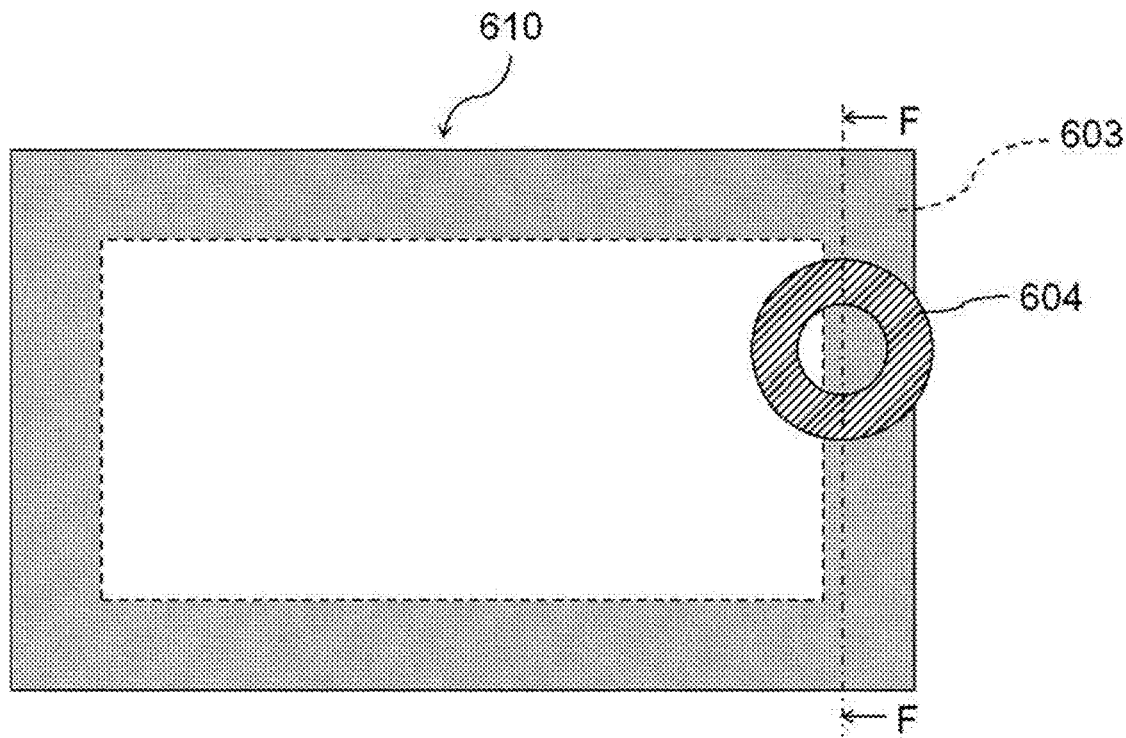
[FIG. 18]
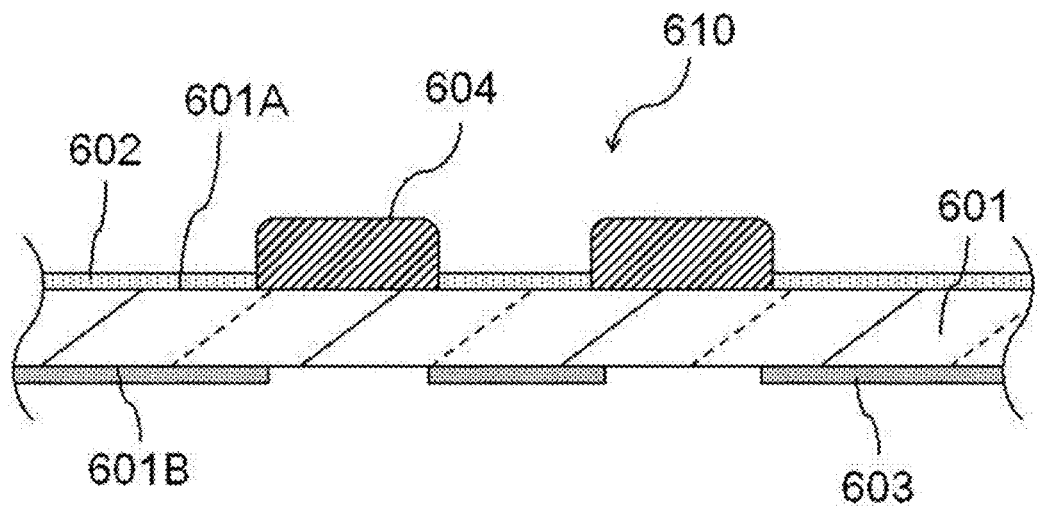

[FIG. 19]
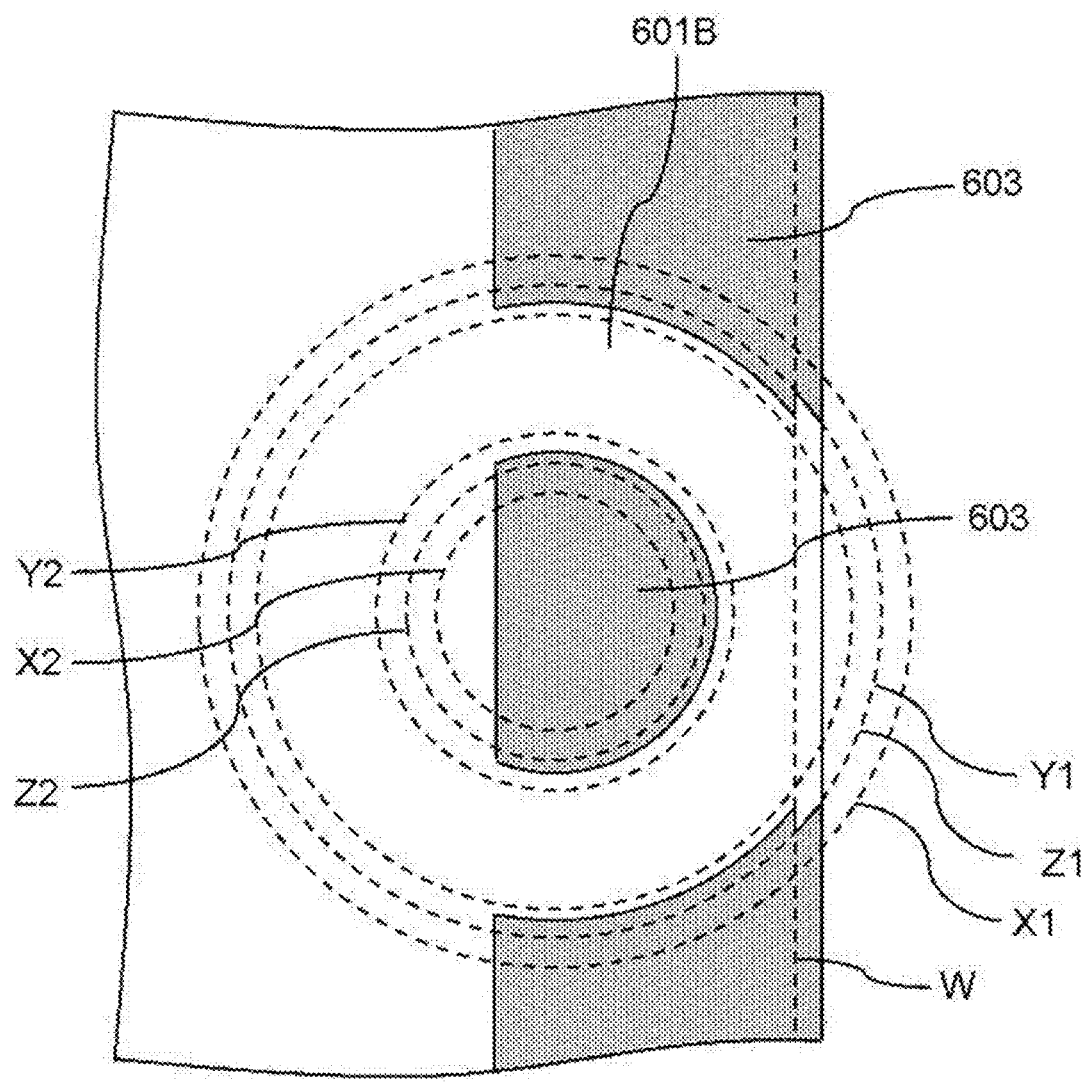

[FIG. 20]
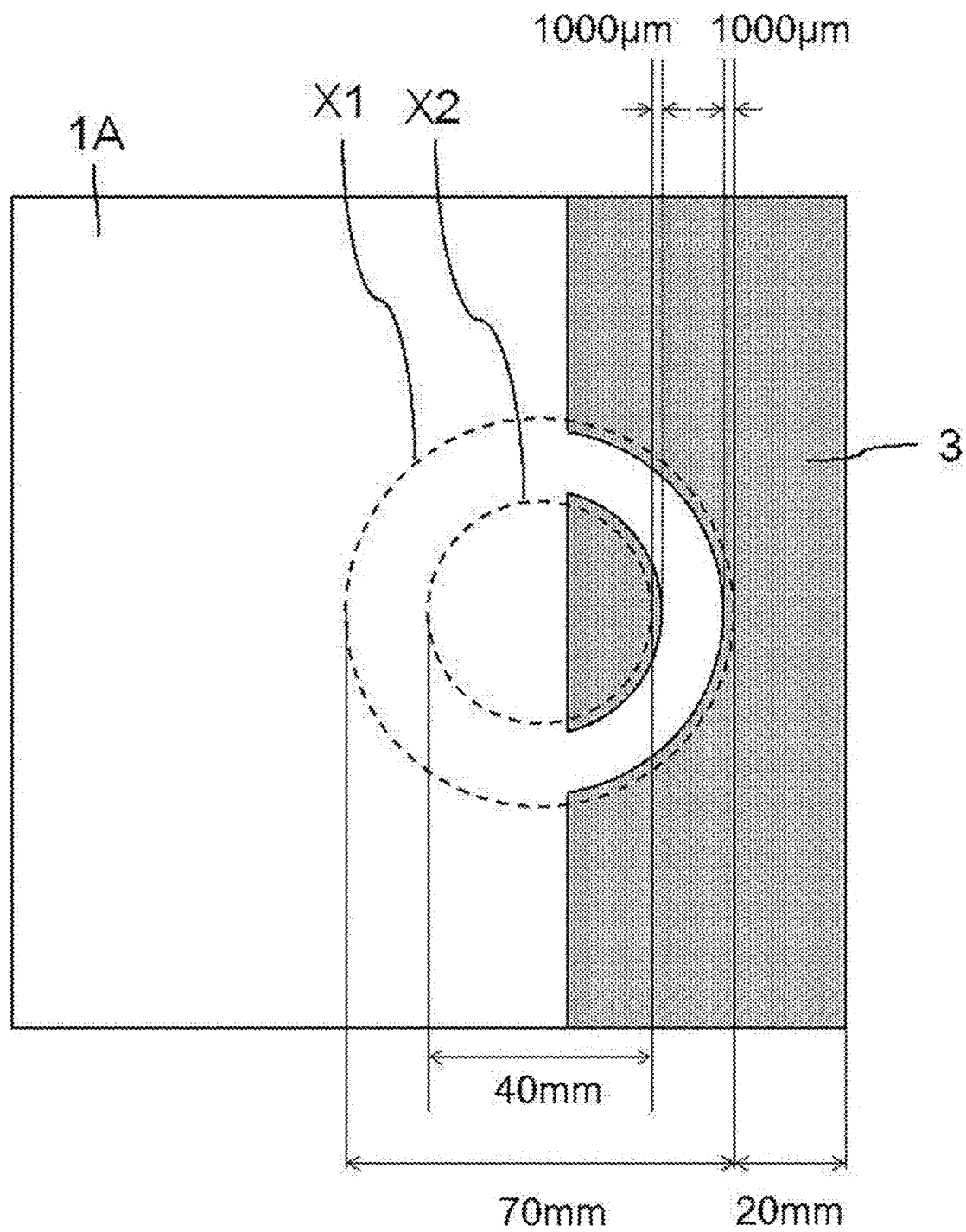

[FIG. 21]
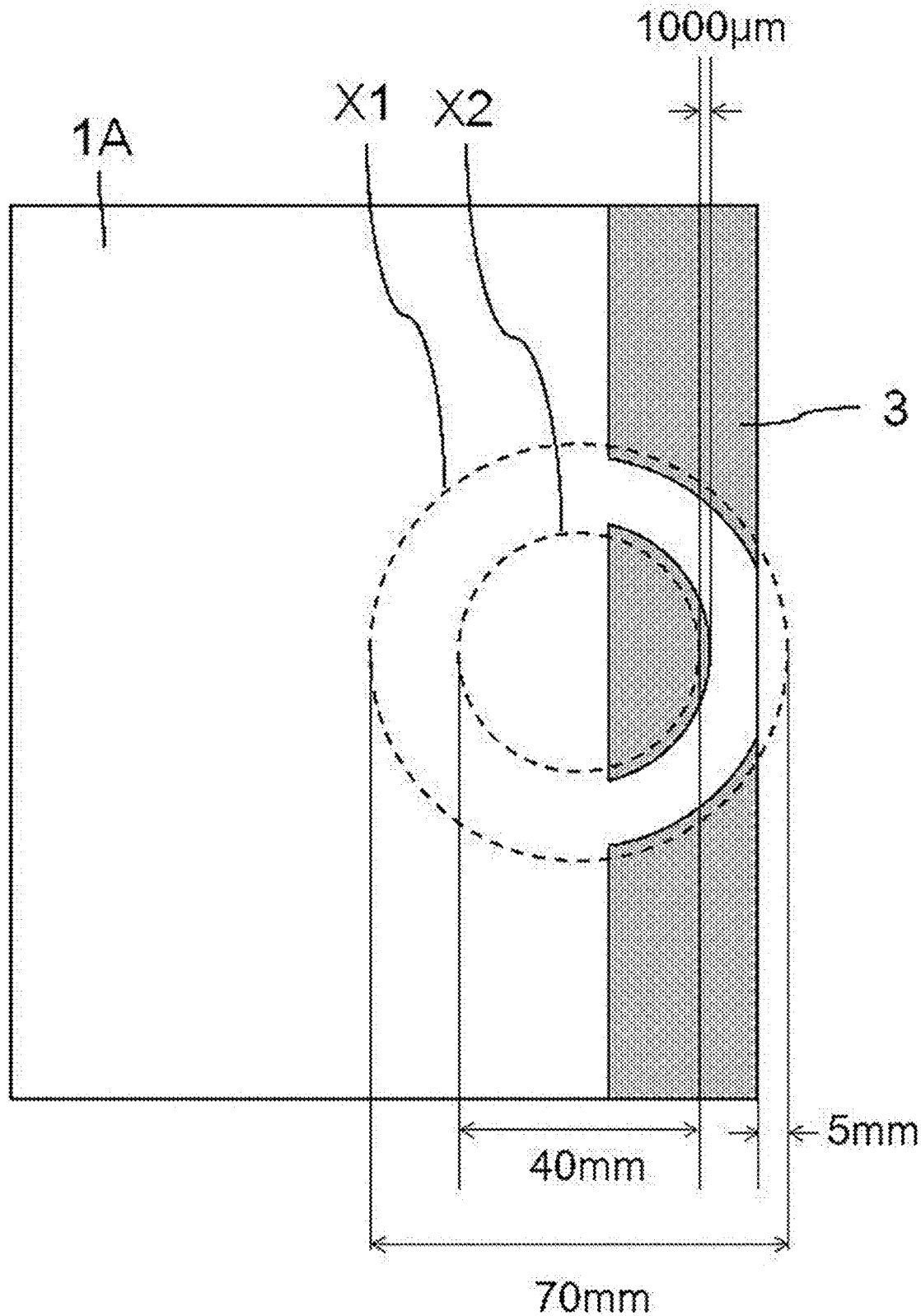

[FIG. 22]
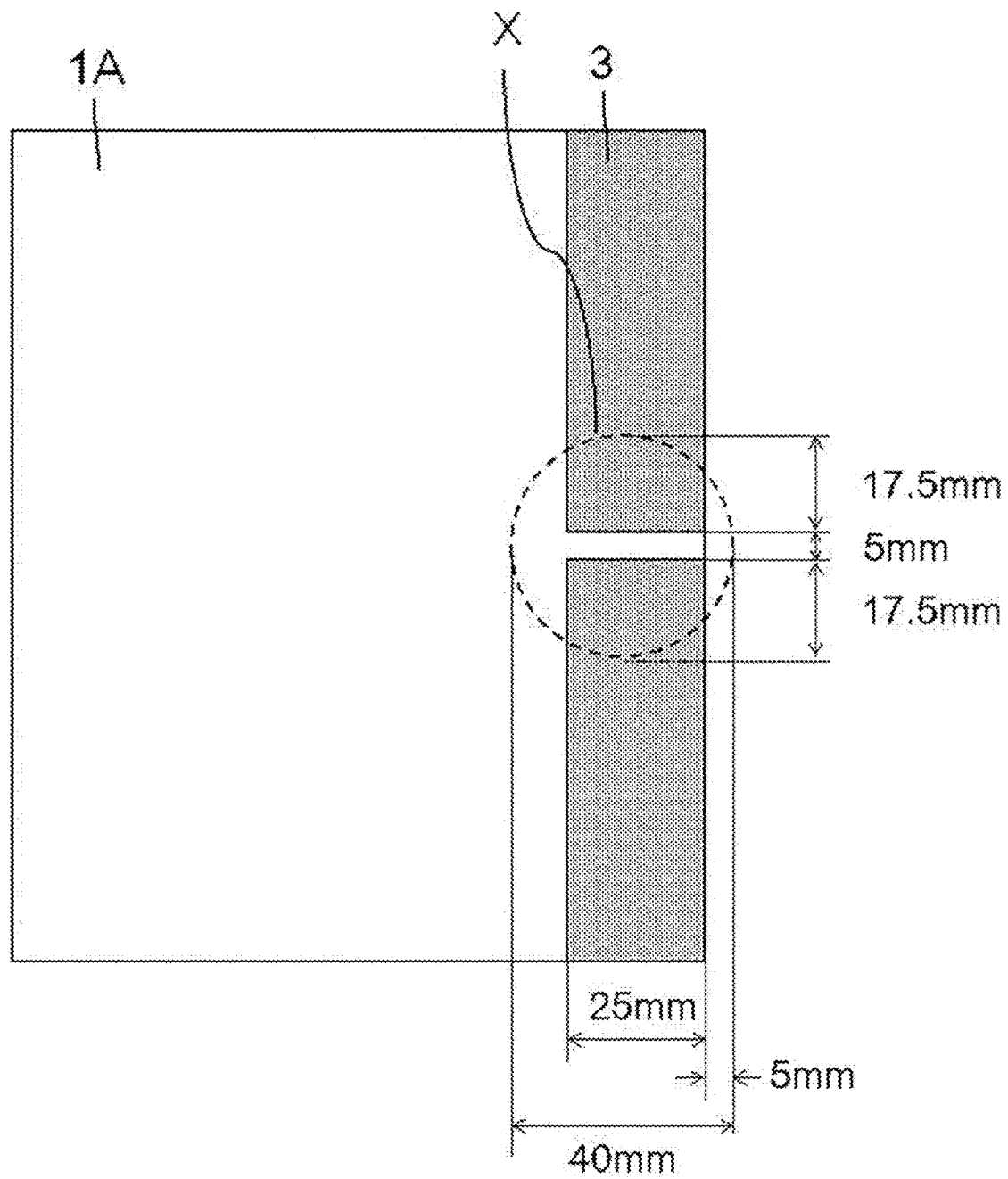

[FIG. 23]
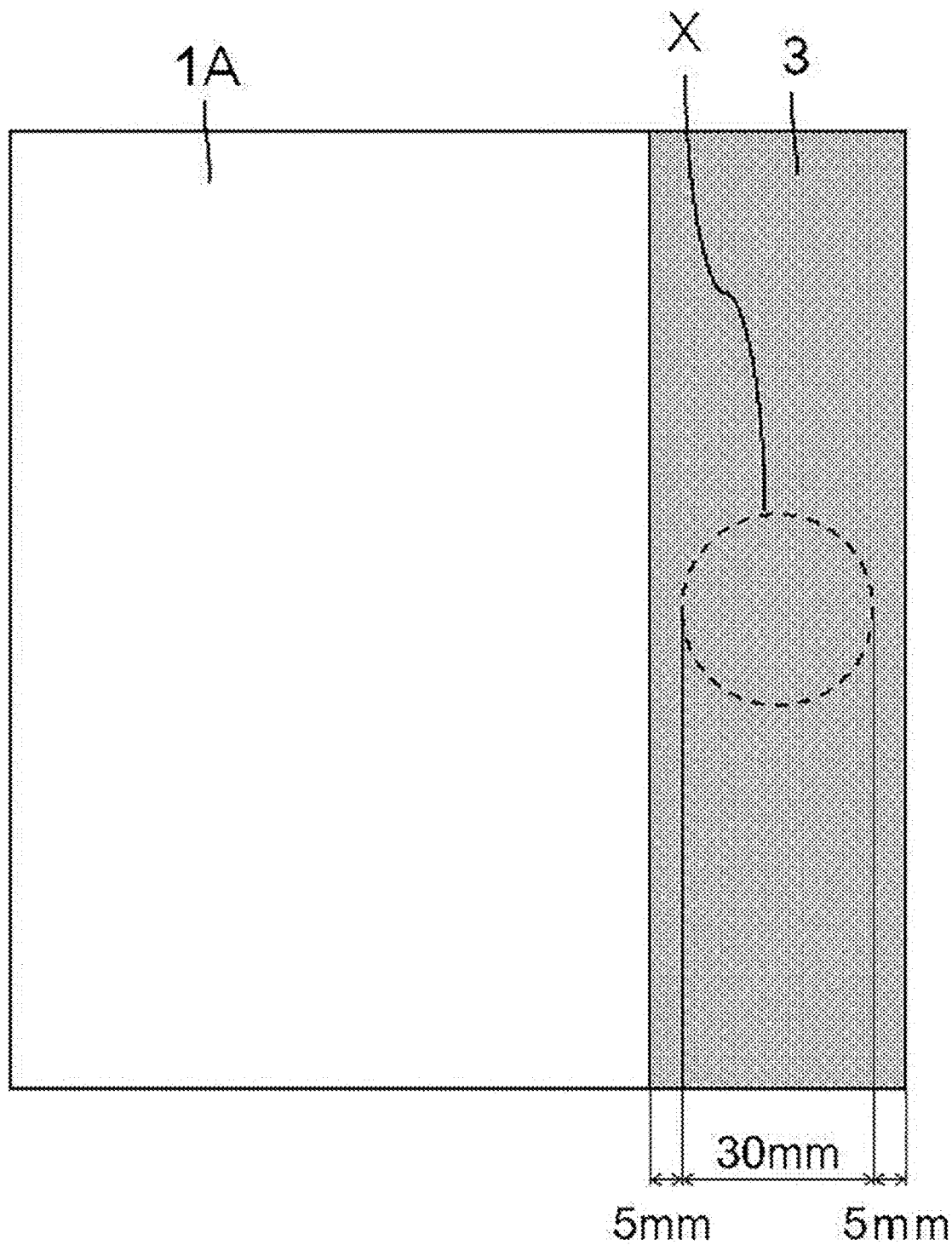

COVER MEMBER

TECHNICAL FIELD

The present invention relates to a cover member.

BACKGROUND ART

In recent years, protective plates for protection of display surface as display or for enhancing appearance attractiveness have come to be frequently used in mobile appliances such as tablet PCs (personal computers) and smartphones or display devices such as liquid-crystal televisions and touch panels (hereinafter these devices are often inclusively referred to as "display devices and the like").

An antifouling layer is frequently formed on those protective plates (hereinafter referred to also as "cover glasses") in order to inhibit the adhesion of soils due to fingerprints, sebaceous matter, sweat, or the like. Furthermore, there are cases where a close-contact layer is formed between the antifouling layer and the protective plate in order to improve the wear resistance of the antifouling layer. There are also cases where antireflection properties or antiglare properties are imparted to the close-contact layer in order to further enhance the visibility of displayed images.

Depending on the use applications, the protective plates are required to undergo attachment of a member to the outermost surface thereof. For example, in the case of the cover glass on a center information display (CID) among vehicle-mounted displays such as automotive navigation systems, there are cases where a member in a button or dial shape for controlling the air conditioner or controlling the volume of the radio, or the like is attached to the surface of the cover glass which is to be touched with a human finger when the display is used.

Patent Document 1 discloses a method for ensuring adhesion between such a member and the uppermost surface of a cover glass.

There are also cases where a printed layer is provided to a cover glass from the standpoints of design attractiveness or the like, as described in Patent Document 1.

CITATION LIST

Patent Literature

Patent Document 1: JP-A-2018-48061

SUMMARY OF INVENTION

Technical Problem

However, the present inventors have newly found out that a cover glass having a dial-shaped or button-shaped member (hereinafter referred to also as "adhered member") attached thereto encounters the following problem in the cases when there is a printed layer on the back surface side of the cover glass in a position corresponding to the position where the member has been attached. Specifically, an operation of the adhered member by a person causes a pushing load to the cover glass. There are also cases where a contact or collision of a person or an object with the adhered member results in a strong force which acts to locally bend the cover glass at a corner of the adhered member. The present inventors have discovered that there is a problem in that if such a strong load is locally imposed many times, not only strong tensile stress occurs locally in the printed layer on the back surface but also a strong shear force is applied to between the cover glass and the printed layer, resulting in a tendency for the printed layer to crack or lift off.

An object of the present invention, which has been achieved in view of that problem, is to provide cover members which are less likely to suffer printed-layer cracking or lifting even when used over a long period.

Solution to the Problem

A first cover member of the present invention, which overcomes the problem, is a cover member including a transparent base, an antifouling layer, a printed layer, and an adhered member, in which the transparent base has a first main surface and a second main surface, the antifouling layer is formed on or above at least a part of the first main surface, the printed layer is formed on or above at least a part of the second main surface, and the adhered member is adhered on a surface on an antifouling layer-side, and in which when an adhered-member-contact-portion projected region is defined as a region in the second main surface to which a region where the adhered member is substantially in contact with the transparent base or with the antifouling layer is projected parallel with a thickness direction of the transparent base, when a near-boundary region is defined as a region in the adhered-member-contact-portion projected region, ranging from a boundary of the region to an inward portion at 1,000 μm from the boundary of the region, and when an inner region is defined as a region in the adhered-member-contact-portion projected region, lying 500 μm or more inside from the boundary of the region, then the printed layer is provided on at least a part of the near-boundary region, and no printed layer is provided on at least a part of the inner region.

In one mode of the cover member of the present invention, the first main surface of the transparent base may further include a region where substantially no antifouling layer is present, in the region where the adhered member is substantially in contact with the transparent base or with the antifouling layer, and when an antifouling-layer-absent-portion projected region is defined as a region in the second main surface to which the region where substantially no antifouling layer is present is projected parallel with the thickness direction of the transparent base, then the inner region may include at least a part of the antifouling-layer-absent-portion projected region, and no printed layer may be provided on the portion of the antifouling-layer-absent-portion projected region included in the inner region.

In one mode of the cover member of the present invention, the inner region may include the entirety of the antifouling-layer-absent-portion projected region.

In one mode of the cover member of the present invention, the adhered member may have a ring shape and at least a part of the inner region may include a portion equipped with no printed layer continuous along a circumferential direction of the ring.

In one mode of the cover member of the present invention, the printed layer may be formed in a zonal manner along an edge of the transparent base, the adhered-member-contact-portion projected region may include one end and another end in a width direction of the printed layer, and the adhered-member-contact-portion projected region may include a continuous portion equipped with no printed layer, between the one end and the another end in the width direction of the printed layer.

In one mode of the cover member of the present invention, when a near-peripheral-edge region is defined as a region in the second main surface, ranging from a peripheral edge thereof to an inward portion at 50 μm from the peripheral edge, then the near-peripheral-edge region may include a part of the inner region, and no printed layer may be provided on the portion of the inner region included in the near-peripheral-edge region.

A second cover member of the present invention, which overcomes the problem described above, is a cover member including a transparent base, an antifouling layer, and a printed layer, in which the transparent base has a first main surface and a second main surface, the antifouling layer is formed on or above at least a part of the first main surface, the printed layer is formed on or above at least a part of the second main surface, the first main surface includes a region where substantially no antifouling layer is present, and when an antifouling-layer-absent-portion projected region is defined as a region in the second main surface to which the region where substantially no antifouling layer is present is projected parallel with a thickness direction of the transparent base, and when an inner region is defined as a region in the antifouling-layer-absent-portion projected region, lying 500 μm or more inside from a boundary of the region, then no printed layer is provided on at least a part of the inner region.

In one mode of the cover member of the present invention, the antifouling-layer-absent-portion projected region may have ring-shaped.

In one mode of the cover member of the present invention, when a near-peripheral-edge region is defined as a region in the second main surface, ranging from a peripheral edge thereof to an inward portion at 50 μm from the peripheral edge, then the near-peripheral-edge region may include a part of the antifouling-layer-absent-portion projected region, and no printed layer may be provided on the portion of the antifouling-layer-absent-portion projected region included in the near-peripheral-edge region.

In one mode of the cover member of the present invention, no printed layer may be provided over the entirety of the antifouling-layer-absent-portion projected region.

In one mode of the cover member of the present invention, the printed layer may be formed in a zonal manner along an edge of the transparent base, the antifouling-layer-absent-portion projected region may include one end and another end in a width direction of the printed layer, and the antifouling-layer-absent-portion projected region may include a continuous portion equipped with no printed layer, between the one end and the another end in the width direction of the printed layer.

In one mode of the cover member of the present invention, the transparent base may be a glass base.

In one mode of the cover member of the present invention, the glass base may be a chemically strengthened glass base.

One mode of the cover member of the present invention may further include a close-contact layer between the first main surface of the transparent base and the antifouling layer.

Advantageous Effect of Invention

The cover members of the present invention are less likely to suffer printed-layer cracking or lifting even when used over a long period.

BRIEF DESCRIPTION OF DRAWINGS

FIG. 1 is a top view of a cover member according to one embodiment of the present invention.

FIG. 2 is a cross-sectional view taken on the line A-A of FIG. 1.

FIG. 3 is a top view of a cover member according to a first mode.

FIG. 4 is a cross-sectional view taken on the line B-B of FIG. 3.

FIG. 5 is an enlarged view of the periphery of an adhered member of the cover member according to the first mode, when observed from the printed-layer side.

FIG. 6 is a top view of a cover member according to a second mode.

FIG. 7 is a cross-sectional view taken on the line C-C of FIG. 6.

FIG. 8 is an enlarged view of the periphery of an adhered member of the cover member according to the second mode, when observed from the printed-layer side.

FIG. 9 is a top view of a cover member according to a third mode.

FIG. 10 is an enlarged view of the periphery of an adhered member of the cover member according to the third mode, when observed from the printed-layer side.

FIG. 11 is a top view of a cover member according to a fourth mode.

FIG. 12 is a cross-sectional view taken on the line D-D of FIG. 11.

FIG. 13 is an enlarged view of the periphery of an adhered member of the cover member according to the fourth mode, when observed from the printed-layer side.

FIG. 14 is a top view of a cover member according to a fifth mode.

FIG. 15 is a cross-sectional view taken on the line E-E of FIG. 14.

FIG. 16 is an enlarged view of the periphery of an adhered member of the cover member according to the fifth mode, when observed from the printed-layer side.

FIG. 17 is a top view of a cover member according to a sixth mode.

FIG. 18 is a cross-sectional view taken on the line F-F of FIG. 17.

FIG. 19 is an enlarged view of the periphery of an adhered member of the cover member according to the sixth mode, when observed from the printed-layer side.

FIG. 20 is a diagrammatic view of the cover member of Example 1, when observed from the printed-layer side.

FIG. 21 is a diagrammatic view of the cover member of Example 2, when observed from the printed-layer side.

FIG. 22 is a diagrammatic view of the cover member of Example 3, when observed from the printed-layer side.

FIG. 23 is a diagrammatic view of the cover member of Example 4, when observed from the printed-layer side.

DESCRIPTION OF EMBODIMENTS

Embodiments of the present invention are explained below. The present invention is not limited to the embodiments explained below. The embodiments illustrated in the drawings have been schematized in order to clearly explain the present invention, and are not always intended to precisely indicate the actual sizes or scales.

First Embodiment

Cover Member

In FIG. 1 is illustrated a top view of a cover member 10 according to a first embodiment of the present invention. In FIG. 2 is illustrated a cross-sectional view taken on the line A-A of FIG. 1.

The cover member 10 according to this embodiment includes a transparent base 1, an antifouling layer 2, a printed layer 3, and an adhered member 4.

The transparent base 1 has a first main surface 1A and a second main surface 1B. The antifouling layer 2 is formed on or above at least a part of the first main surface 1A of the transparent base 1. The printed layer 3 is formed on or above at least a part of the second main surface 1B of the transparent base 1. The adhered member is adhered to a surface on an antifouling layer 2-side.

These components are explained in detail below.

Transparent Base

The transparent base 1 is not particularly limited so long as it is constituted of a transparent material. For example, it is preferred to use a material such as a glass, a resin, a composite material or layered material including such materials in combination, and the like.

Examples of the resin usable as a material for the transparent base include acrylic resins such as poly(methyl methacrylate), aromatic polycarbonate resins such as carbonate of bisphenol A, aromatic polyester resins such as poly(ethylene terephthalate), and the like.

Examples of the glass usable as a material for the transparent base include general glasses including silicon dioxide as a main component, such as soda-lime silicate glasses, aluminosilicate glasses, borosilicate glasses, alkali-free glasses, and quartz glass, and the like.

In the case of using a glass base as the transparent base, the glass preferably has a composition which enables the glass to be strengthened by forming or by a chemical strengthening treatment and which preferably contains sodium.

The glass is not particularly limited in its composition, and glasses having various compositions can be used. For example, use can be made of aluminosilicate glasses having the following compositions in terms of mol % on oxides basis. (i) A glass including 50-80% $SiO_2$, 2-25% $Al_2O_3$, 0-20% $Li_2O$, 0-18% $Na_2O$, 0-10% $K_2O$, 0-15% MgO, 0-5% CaO, 0-5% $Y_2O_3$, and 0-5% $ZrO_2$. (ii) A glass including 50-74% $SiO_2$, 1-10% $Al_2O_3$, 6-14% $Na_2O$, 3-11% $K_2O$, 2-15% MgO, 0-6% CaO, and 0-5% $ZrO_2$, the total content of $SiO_2$ and $Al_2O_3$ being 75% or less, the total content of $Na_2O$ and $K_2O$ being 12-25%, and the total content of MgO and CaO being 7-15%. (iii) A glass including 68-80% $SiO_2$, 4-10% $Al_2O_3$, 5-15% $Na_2O$, 0-1% $K_2O$, 4-15% MgO, and 0-1% $ZrO_2$. (iv) A glass including 67-75% $SiO_2$, 0-4% $Al_2O_3$, 7-15% $Na_2O$, 1-9% $K_2O$, 6-14% MgO, and 0-1.5% $ZrO_2$, the total content of $SiO_2$ and $Al_2O_3$ being 71-75%, the total content of $Na_2O$ and $K_2O$ being 12-20%, and the content of CaO, when it is contained, being less than 1%.

From the standpoints of design attractiveness and strength, a glass base is preferred as the transparent base.

Methods for producing the glass base are not particularly limited. For example, the glass base can be produced by introducing raw materials for glass into a melting furnace so as to result in a desired composition, heating and melting the raw materials at 1,500-1,600° C., refining the melt, thereafter feeding the molten glass to a forming device to form into a plate shape, and gradually cooling the glass plate. Forming methods for producing the glass base are not limited to this method, and use can be made, for example, of downdraw processes such as an overflow downdraw process, a slit down process, and a re-drawing process, a float process, a rolling-out process, pressing process, and the like.

In the case of using a glass base as the transparent base, this glass base is preferably a strengthened glass base. In particular, the glass base is preferably a chemically strengthened glass base, which has undergone a chemical strengthening treatment.

Methods for the chemical strengthening treatment are not particularly limited, and the main surface of a glass base is caused to undergo ion exchange to form a surface layer (compression stress layer) in which compression stress remains. Specifically, alkali metal ions having a small ionic radius which are contained in the vicinity of the main surface of the glass base are replaced by other alkali metal ions having a larger ionic radius, at a temperature of the glass transition point or lower. As a result, compression stress remains in the main surface of the glass base to improve the strength of the glass base. The alkali metal ions having a small ionic radius are, for example, Li ions or Na ions. The alkali metal ions having a larger ionic radius are, for example, Na or K ions for Li ions or K ions for Na ions.

The glass base as the transparent base preferably satisfies the requirements shown below. The chemical strengthening treatment renders the glass base capable of satisfying the following requirements.

From the standpoint of practical strength, the glass base has a surface compression stress (hereinafter referred to as CS) of preferably 400 MPa or higher, and more preferably 700 MPa or higher. From the standpoint of eliminating a possibility that the glass base cannot withstand its own compression stress and might break by itself, the CS of the glass base is preferably 1,200 MPa or lower, more preferably 900 MPa or lower, and still more preferably 850 MPa or lower.

Especially in the case where the cover member according to this embodiment is to be used as the cover member (cover glass) of a display device, the CS of the glass base is preferably 700 MPa or higher and 850 MPa or lower.

The glass base has a depth of compression stress layer (hereinafter referred to as DOL) of preferably 15 μm or larger, more preferably 20 μm or larger and still more preferably 25 μm or larger, from a standpoint that the glass base is less apt to break even when scratched by a collision with a pointed article. Meanwhile, from the standpoint of eliminating the possibility that the glass base cannot withstand its own compression stress and might break by itself, the DOL of the glass base is preferably 150 μm or smaller, more preferably 100 μm or smaller, still more preferably 80 μm or smaller, and especially preferably 60 μm or smaller.

Especially in the case where the cover member according to this embodiment is to be used as the cover member (cover glass) of a display device, the DOL of the glass base is preferably 25 μm or larger and 60 μm or smaller.

In the case of a glass base containing $LiO_2$, a further improvement in strength can be attained by subjecting the glass base to two or more chemical strengthening treatments.

Specifically, for example, in the first treatment, the glass base is brought into contact with an inorganic-salt composition mainly containing, for example, sodium nitrate salt to conduct ion exchange between Na and Li. Subsequently in the second treatment, the glass base is brought into contact with another inorganic-salt composition mainly containing, for example, potassium nitrate salt to conduct ion exchange between K and Na. Performing chemical strengthening in such a manner is preferred because a compression stress layer having a large DOL and high surface stress can be formed.

A thickness of the transparent base can be suitably selected in accordance with applications. For example, in the case of a resin base, a glass base, or the like, the thickness thereof is preferably 0.1-5 mm, and more preferably 0.2-2 mm.

In the case where a glass base for use as the transparent base 1 is to be subjected to the chemical strengthening treatments, the thickness of the glass base is usually preferably 5 mm or less, and more preferably 3 mm or less, from the standpoint of effectively preforming the treatments.

Dimensions of the transparent base can be suitably selected in accordance with applications. In the case of use as the cover glass of a display device, the dimensions thereof are preferably from 50 mm×100 mm to 2,000 mm×1,500 mm, and the thickness thereof is preferably 0.5-4 mm.

Besides being a flat shape, the shape of the transparent base may be a shape including a curved surface, such as that of a base having one or more bent portions. For example, various appliances equipped with image display devices, such as televisions, personal computers, smartphones, and automotive navigation systems, in which the image display devices have a curved screen surface have come to appear recently. In the case where the transparent base has a shape including a curved surface, the cover member is suitable for use as the cover member of such an image display device.

In the case where the transparent base has a curved surface, the surface of this transparent base may be wholly configured of the curved surface or may be configured to include a curved portion and a flat portion. Examples of the case where the surface is wholly configured of a curved surface include a transparent base having a cross-section of a circular-arc shape.

In the case where the transparent base has a curved surface, the radius of curvature (hereinafter referred to also as "R") thereof can be suitably set in accordance with the intended use, kind, or the like of the transparent base, and is not particularly limited. For example, the R thereof is preferably 25,000 mm or less, more preferably 1 mm to 5,000 mm, and especially preferably 5 mm to 3,000 mm. In cases when the R thereof is not higher than the upper limit, this transparent base is superior in design attractiveness to flat plates. In cases when the R thereof is not less than the lower limit, the antifouling layer 2 and the printed layer 3 can be evenly formed also on the curved surface.

A surface of the transparent base may have undergone an antiglare treatment. In the case where the transparent base is a glass base, antiglare properties may be imparted by forming an uneven structure on one main surface of the glass base by a method such as a spraying method in which the glass base surface is coated with a liquid containing fine silica particles or a frosting treatment (also called antiglare treatment) in which the glass base surface is etched.

Methods for the frosting treatment are not particularly limited, and known methods can be used, such as, for example, the method described in International Publication WO 2014/112297.

Antifouling Layer

The antifouling layer 2 has water repellency and oil repellency and thereby exhibits antifouling properties, and is not particularly limited in materials therefor so long as they can impart antifouling properties to the first main surface 1A of the transparent base 1. For example, the antifouling layer 2 is preferably constituted of a fluorinated-organosilicon-compound coating film obtained by curing a fluorinated organosilicon compound. Examples of the fluorinated organosilicon compound include fluorinated hydrolyzable silicon compounds. In this description, the term "fluorinated hydrolyzable silicon compound" means a compound which includes a hydrolyzable silyl group having a silicon atom to which a hydrolyzable group or atom is bonded and which further includes a fluorinated organic group bonded to the silicon atom. Incidentally, the hydrolyzable group or atom bonded to a silicon atom to constitute a hydrolyzable silyl group is inclusively referred to as "hydrolyzable group".

As a composition used for forming the antifouling layer, a composition containing a fluorinated hydrolyzable silicon compound can be advantageously used. Specifically, the following can be advantageously used: KP-801 (trade name; manufactured by Shin-Etsu Chemical Co., Ltd.), X-71 (trade name; manufactured by Shin-Etsu Chemical Co., Ltd.), KY-130 (trade name; manufactured by Shin-Etsu Chemical Co., Ltd.), KY-178 (trade name; manufactured by Shin-Etsu Chemical Co., Ltd.), KY-185 (trade name; manufactured by Shin-Etsu Chemical Co., Ltd.), OPTOOL (registered trademark) DSX (trade name; manufactured by Daikin Industries, Ltd.), and the like.

Such a composition for coating film formation, which contains a fluorinated hydrolyzable silicon compound, is adhered to a surface of the transparent base or to a surface of a close-contact layer which will be described later, to react to form a film. Thus, a fluorinated-organosilicon-compound coating film is obtained.

The thickness of the antifouling layer is not particularly limited. However, from the standpoint of improving the evenness to improve abrasion resistance, the thickness thereof is preferably 2 nm or larger. Meanwhile, from the standpoint of enabling the cover member to have satisfactory optical properties including haze vale, the thickness of the antifouling layer is preferably 20 nm or smaller, more preferably 15 nm or smaller, and still more preferably 10 nm or smaller.

Examples of film formation methods for forming the antifouling layer include wet processes such as spin coating, dip coating, casting, slit coating, and spray coating, vapor deposition methods, and the like. For obtaining a coating film having high adhesion to the transparent base or to the close-contact layer which will be described later, the antifouling layer is preferably formed by a vacuum deposition method.

On the first main surface 1A of the transparent base 1 in this embodiment, it is preferable that substantially no antifouling layer is present in at least a part of the portion where the adhered member 4 is to be adhered. By adhering the adhered member on a portion equipped with no antifouling layer, high adhesion strength is obtained.

The expression "substantially no antifouling layer is present" means that when the surface is subjected to compositional analysis with a μ-X-ray photoelectron spectroscope, the peak count (cps) of fluorine atoms (F) is 62% or less of a value for a region where the antifouling layer is present.

Means for forming a region where no antifouling layer is present are not particularly limited, and known techniques can be used, such as masking, a laser marker, corona discharge, a plasma, and laser cleaning. More specifically, a region where no antifouling layer is present may be formed, for example, by masking, with a tape or the like, a portion where an antifouling layer is not to be formed, forming an antifouling layer on the surface in the masked state, and thereafter removing the tape or the like. As the tape or the like, it is preferred to use a PET tape, a polyimide tape, or the like.

Alternatively, a region where no antifouling layer is present may be formed by first forming an antifouling layer on the entirety of the first main surface of the transparent base and thereafter partly removing the antifouling layer with a laser, a plasma or the like, as described in Patent Document 1. In this case, the partial removal of the antifouling layer can be attained by, for example, masking the portion where the antifouling layer is not to be removed, with a heat-resistant thin plate or the like, such as a glass, alumina, or Bakelite, and then performing the treatment with a laser, plasma or the like.

Close-Contact Layer

For ensuring the adhesion of the antifouling layer 2, the cover member according to this embodiment may include a close-contact layer disposed between the transparent base and the antifouling layer. The outermost layer of the close-contact layer on the side facing the antifouling layer is preferably a layer containing silicon oxide as a main component, from the standpoint of adhesion to the antifouling layer.

The surface of the close-contact layer which is in contact with the antifouling layer has a surface roughness of preferably 3 nm or less, more preferably 2 nm or less, and still more preferably 1.5 nm or less, in terms of arithmetic mean roughness (Ra). In the case where the Ra thereof is 3 nm or less, the surface is so smooth that the antifouling layer can be inhibited from catching fabric or the like and has improved wear resistance.

In the case where the first main surface 1A has uneven shape formed by, for example, an antiglare treatment, it is only required to set a measurement area including no such uneven structure in making a measurement for determining the arithmetic mean roughness (Ra) of the close-contact layer. The Ra of the close-contact layer can be determined by setting, for example, a measurement area to an area excluding the ridges of protrusions.

Furthermore, in the case where the first main surface 1A of the transparent base 1 has uneven shape formed by, for example, an antiglare treatment, the surface of the close-contact layer which is in contact with the antifouling layer has a mean-square roughness (Rq) of preferably 10 nm or higher, and more preferably 20 nm or higher. Meanwhile, the Rq thereof is preferably 1,500 nm or lower, more preferably 1,000 nm or lower, still more preferably 500 nm or lower, and especially preferably 200 nm or lower. In the case where the Rq thereof is within that range, the antifouling layer not only is inhibited from lifting off and has improved wear resistance but also can have antiglare or non-glittering properties. In making a measurement for determining the Rq of the uneven shape, it is only required to select a measurement area sufficiently containing the uneven shape of the first main surface, in contrast to the above-described measurement for determining the arithmetic mean roughness (Ra) of the close-contact layer. Since the surface roghnesses of the close-contact layer and antifouling layer are sufficiently smooth, the value of Rq measured by the above-described method in the state of having the close-contact layer and antifouling layer may be considered to be the same as the value of Rq of the uneven shape. Methods for forming the close-contact layer are not particularly limited, but the close-contact layer can be formed, for example, by the same methods as for forming the layer including silicon oxide as a main component, in the low-reflection layer that will be described below.

Low-Reflection Layer

A low-reflection layer is a film which not only has a reflectance-reducing effect to diminish the glaringness due to light reflection in display screens but also can improve the transmittance of light from display devices or the like to improve the visibility of images displayed on the display devices or the like.

The cover member according to this embodiment preferably includes a low-reflection layer disposed between the first main surface of the transparent base and the antifouling layer. The low-reflection layer is not particularly limited in its configuration so long as light reflection can be inhibited thereby. For example, the low-reflection layer can have a configuration formed by superposing a high-refractive-index layer(s) having a refractive index at 550-nm wavelength of 1.9 or higher and a low-refractive-index layer(s) having a refractive index at 550-nm wavelength of 1.6 or less. The low-reflection layer may have a configuration including only one low-refractive-index layer.

The low-reflection layer may have a configuration including one high-refractive-index layer and one low-refractive-index layer or may have a configuration including two or more high-refractive-index layers and two or more low-refractive-index layers. In the case where the low-reflection layer includes two or more high-refractive-index layers and two or more low-refractive-index layers, this low-reflection layer preferably has a configuration formed by alternately superposing the high-refractive-index layers and the low-refractive-index layers.

From the standpoint of enhancing the reflectance-reducing effect, the low-reflection layer is preferably a multilayer structure composed of a plurality of superposed layers. For example, the multilayer structure is preferably composed of two to ten superposed layers in total, more preferably composed of two to eight superposed layers, and still more preferably composed of four to six superposed layers. This multilayer structure preferably is one formed by superposing a high-refractive-index layer(s) and a low-refractive-index layer(s), as described above.

Materials for the high-refractive-index layers and low-refractive-index layers are not particularly limited, and can be suitably selected in view of the required degree of reflectance-reducing effect, production efficiency, and the like. For constituting the high-refractive-index layers, one or more materials selected, for example, from among niobium oxide ($Nb_2O_5$), titanium oxide ($TiO_2$), zirconium oxide ($ZrO_2$), tantalum oxide ($Ta_2O_5$), and silicon nitride ($Si_3N_4$) can be advantageously used. For constituting the low-refractive-index layers, one or more materials selected, for example, from among silicon oxide ($SiO_2$), materials including a mixed oxide of Si and Sn, materials including a mixed oxide of Si and Zr, and materials including a mixed oxide of Si and Al can be advantageously used.

From the standpoints of production efficiency and refractive index, a preferred configuration is one in which the high-refractive-index layer is a layer including, as a main component, one material selected from among niobium oxide, tantalum oxide, and silicon nitride, and the low-refractive-index layer is a layer including silicon oxide as a main component.

By configuring the low-reflection layer so that the outermost layer thereof includes silicon oxide as a main component, this low-reflection layer can be used also as a close-contact layer.

The low-reflection layer is preferably formed by a dry film deposition method. Examples of the dry film deposition method include vapor deposition methods, ion-beam-assisted vapor deposition, ion plating, sputtering, plasma CVD, and the like. Preferred of these is a vapor deposition method or sputtering.

Adhered Member

The adhered member 4 is, for example, a frame of a push button, a switch, a dial, a meter, or the like, a decorative member bearing a logo, mark or the like, or the like. As a material for forming the adhered member 4, use can be made, for example, of a resinous material, a metallic material, a rubbery material, and the like.

The shape of the adhered member is not particularly limited, and may be, for example, a circular, elliptic, quadrilateral, or ring shape.

The adhered member 4 is not particularly limited in the adhesive used for the bonding thereof. For example, an epoxy, cyanoacrylate, thermosetting-resin, elastomer-based, or another adhesive can be used. The kind of adhesive is not particularly limited so long as the adhered member can be bonded therewith to glass articles. However, adhesives having excellent durability are preferred.

The adhered member may have been attached so that the whole adhered member lies over the cover member or so that only a part of the adhered member lies over the cover member, when the cover member is observed from the antifouling-layer side. That is, a part of the adhered member may lie outside the cover member when the cover member is observed from the antifouling-layer side.

In the case where the adhered member is a member, the handling of which is accompanied with transmission of desired information, such as a push button, a switch, or a dial, there are no particular limitations on means for transmitting the information. For example, the information may be transmitted to a receiver disposed, for example, on the back side of the transparent base, by means of magnetic force or electrostatic force or via wiring. In the case of using wiring, a part of the adhered member preferably lies outside the cover member. This is because the wiring can be easily hidden or the like.

Printed Layer

The cover member 10 according to this embodiment includes a printed layer 3 formed on or above at least a part of the second main surface 1B of the transparent base 1. The printed layer 3 may be a light-shielding part which conceals portions that lie in the way of the field of view of displayed images, such as a wiring circuit disposed in a peripheral portion of the display panel, and which thereby enhances the visibility of displayed images and the appearance attractiveness. The printed layer 3 may also be a printed part formed by printing characters, a pattern, or the like.

The printed layer is a layer formed by printing an ink. Examples of methods for the printing include bar coating, reverse coating, gravure coating, die coating, roll coating, screen printing, ink-jet printing, and the like. A preferred printing method is screen printing or ink-jet printing, because not only these methods enable easy printing but also various bases can be printed in accordance with the sizes of the bases.

The kind of ink is not particularly limited. For example, use can be made of an inorganic ink containing a burned ceramic or the like or an organic ink containing both a colorant such as a dye or a pigment and an organic resin.

Examples of the ceramic contained in the inorganic ink include oxides such as chromium oxide and iron oxide, carbides such as chromium carbide and tungsten carbide, carbon black, mica, and the like. A printed part is obtained, for example, by melting an inorganic ink containing such a ceramic and silica, printing the molten ink on the second main surface 1B of the transparent base 1 so as to form a desired pattern, and then burning the printed ink. Such inorganic inks necessitate melting and burning steps and are generally used as inks exclusively for glasses.

The organic ink is a composition containing a dye or pigment and an organic resin. Examples of the organic resin include resins constituted of homopolymers, such as epoxy resins, acrylic resins, poly(ethylene terephthalate), polyethersulfones, polyarylates, polycarbonates, transparent ABS resins, phenolic resins, acrylonitrile-butadiene-styrene resins, polyurethanes, poly(methyl methacrylate), polyvinyls, poly(vinyl butyral), polyetheretherketones, polyethylene, polyesters, polypropylene, polyamides, and polyimides, and resins constituted of copolymers of monomers of these resins with monomers copolymerizable therewith. The organic resin may be a mixture of these resins. In addition, any dye or pigment having light-shielding properties can be used without particular limitations.

The organic ink is preferred to the inorganic ink because of the low burning temperatures. From the standpoint of chemical resistance, pigment-containing organic inks are preferred.

The printed layer may be composed of a plurality of superposed layers or may be a single layer. The printed layer composed of a plurality of layers can be formed by repeating the printing and drying of the ink.

The thickness of the printed layer is not particularly limited. However, from the standpoint of obtaining sufficient light-shielding properties, the thickness thereof is preferably 2 μm or larger, and more preferably 5 μm or larger. Meanwhile, from the standpoint of inhibiting air bubbles from being trapped when the cover member is bonded to a display or of inhibiting the printed layer from lifting off due to internal stress, the thickness of the printed layer is preferably 50 μm or smaller, and more preferably 30 μm or smaller.

Relationship Between Printed Layer and Adhered Member

In the cover member according to this embodiment, an adhered-m ember-contact-portion projected region is defined as follows.

The term "adhered-member-contact-portion projected region" means a region formed by projecting a region where the adhered member is substantially in contact with the transparent base or with the antifouling layer, parallel with the thickness direction of the transparent base on the second main surface. The expression "region where the adhered member is substantially in contact with the transparent base or with the antifouling layer" means a conception including not only a region where the adhered member is in close-contact with the transparent base or with the antifouling layer but also a region where the distance from the adhered member to the transparent base or to the antifouling layer (distance along a direction perpendicular to the first main surface) is 1 mm or less.

In the adhered-member-contact-portion projected region, a region ranging from a boundary of the region to an inward portion at 1,000 μm from the boundary of the region is defined as a near-boundary region.

In the adhered-member-contact-portion projected region, a region lying 500 μm or more inside from the boundary of the region is defined as an inner region.

Furthermore, in the case where the region where the adhered member is substantially in contact with the transparent base or with the antifouling layer includes a region where substantially no antifouling layer is present, then a region formed by projecting the region where substantially no antifouling layer is present, parallel with the thickness direction of the transparent base on the second main surface is defined as an antifouling-layer-absent-portion projected region.

Relationships between these regions and the printed layer are explained in detail below. First, regarding these regions, a plurality of modes are explained as examples of the cover member according to this embodiment, by referring to the drawings.

A cover member 110 containing an adhered member 104 having a circular shape when observed from the antifouling-layer side is explained as a first mode.

In FIG. 3 is illustrated a top view of the cover member 110 according to the first mode observed from the antifouling-layer side. In FIG. 4 is illustrated an enlarged view of the periphery of the adhered member 104 in a cross-sectional view taken on the line B-B of FIG. 3. In FIG. 5 is illustrated an enlarged view of the periphery of the adhered member 104 of the cover member 110 according to the first mode, when observed from the printed-layer side.

Dotted line X in FIG. 5 is a line formed by projecting the boundary of a region where the adhered member 104 is substantially in contact with a transparent base 101 or with an antifouling layer 102, parallel with the thickness direction of the transparent base 101 on a second main surface 101B of the transparent base 101. That is, the region partitioned off by the dotted line X (region inside the dotted line X) is an adhered-member-contact-portion projected region.

Dotted line Y in FIG. 5 is a line indicating an inward portion at 1,000 μm from the boundary of the adhered-member-contact-portion projected region (i.e., from the dotted line X). That is, the region ranging from the dotted line X to the dotted line Y is a near-boundary region.

Dotted line Z in FIG. 5 is a line indicating an inward portion at 500 μm from the boundary of the adhered-member-contact-portion projected region (i.e., from the dotted line X). That is, the region partitioned off by the dotted line Z (region inside the dotted line Z) is an inner region.

The antifouling-layer-absent-portion projected region is not illustrated in the figure. The same applies in the following examples.

A cover member 210 containing an adhered member 204 having a ring shape (hereinafter also called "doughnut shape") when observed from the antifouling-layer side is explained as a second mode.

In FIG. 6 is illustrated a top view of the cover member 210 according to the second mode observed from the antifouling-layer side. In FIG. 7 is illustrated an enlarged view of the periphery of the adhered member 204 in a cross-sectional view taken on the line C-C of FIG. 6. In FIG. 8 is illustrated an enlarged view of the periphery of the adhered member 204 of the cover member 210 according to the second mode, when observed from the printed-layer side.

Dotted lines X1 and X2 in FIG. 8 are lines respectively formed by projecting the boundaries of a region where the adhered member 204 is substantially in contact with a transparent base 201 or with an antifouling layer 202, parallel with the thickness direction of the transparent base 201 on a second main surface 201B of the transparent base 201. That is, the region ranging from the dotted line X1 to the dotted line X2 is an adhered-member-contact-portion projected region.

Dotted line Y1 in FIG. 8 is a line indicating an inward portion at 1,000 μm from the outer boundary of the adhered-member-contact-portion projected region (i.e., from the dotted line X1). Dotted line Y2 is a line indicating an inward portion at 1,000 μm from the inner boundary of the adhered-member-contact-portion projected region (i.e., from the dotted line X2). That is, in the second mode, a combined region of the region ranging from the dotted line X1 to the dotted line Y1 and the region ranging from the dotted line X2 to the dotted line Y2 is a near-boundary region.

Dotted line Z1 in FIG. 8 is a line indicating an inward portion at 500 μm from the outer boundary of the adhered-member-contact-portion projected region (i.e., from the dotted line X1). Dotted line Z2 is a line indicating an inward portion at 500 μm from the inner boundary of the adhered-member-contact-portion projected region (i.e., from the dotted line X2). That is, in the second mode, the region ranging from the dotted line Z1 to the dotted line Z2 is an inner region.

As illustrated in FIG. 5 and FIG. 8, in the cover member according to this embodiment, the inner regions each include a region where no printed layer is present. That is, in the cover member according to this embodiment, at least a part of the inner region is equipped with no printed layer. This configuration can inhibit the printed layer from being applied with strong tensile stress even when a load is imposed on the adhered member to cause the adhered-member-contact-portion projected region of the second main surface to have local stress. Consequently, the printed layer is less apt to crack or break.

As described above, the printed layer can be inhibited from cracking or breaking by disposing a region having no printed layer, within the adhered-member-contact-portion projected region. However, in the case where there is no printed layer in the vicinity of the boundary of the adhered-member-contact-portion projected region, then the edge of the printed layer is undesirably noticed when the vicinity of the adhered member is observed from an oblique direction, and this may lessen the appearance attractiveness.

Because of this, in the cover member according to this embodiment, the near-boundary region includes a region where a printed layer is present, as illustrated in FIG. 5 and FIG. 8. That is, in the cover member according to this embodiment, at least a part of the near-boundary region is equipped with a printed layer. As a result, the possibility that the edge of the printed layer might be visually recognized to lessen the appearance attractiveness is low.

From the standpoint of improving the appearance attractiveness, the near-boundary region is preferably configured so that a printed layer is provided so as to cover the entirety of a region ranging from the boundary of the adhered-member-contact-portion projected region (i.e., from the dotted line X in FIG. 5 or from the dotted lines X1 and X2 in FIG. 8) to preferably 10 μm inside therefrom, more preferably 50 μm inside therefrom, and still more preferably 100 μm inside therefrom.

Meanwhile, although being a region which affects the appearance attractiveness, the near-boundary region is also a region which is especially prone to suffer stress when a load is imposed on the adhered member. Consequently, from the standpoint of inhibiting the cracking or breaking of the printed layer, at least a part of the near-boundary region is preferably equipped with no printed layer.

Furthermore, especially in the region where the antifouling layer has been removed, the second main surface is especially prone to suffer stress when a load is imposed on the adhered member since the adhered member has been bonded to the first main surface of the transparent base. Consequently, at least a part of the antifouling-layer-absent-portion projected region is preferably equipped with no printed layer. More preferably, the entirety of the antifouling-layer-absent-portion projected region is equipped with no printed layer. Especially in the case where the antifouling-layer-absent-portion projected region is included in the inner region, the portion of the antifouling-layer-absent-portion projected region included in the inner region is preferably equipped with no printed layer. A part of the antifouling-layer-absent-portion projected region may be included in the inner region or the entirety of the antifouling-layer-absent-portion projected region may be included in the inner region.

The first and second modes described above are examples in each of which a printed layer is formed in a zonal manner when observed from the antifouling-layer side, along the edges of the transparent base and the whole adhered member lies within the width direction of this printed layer. However, in the cover member according to this embodiment, not entirety of the adhered member may lie within the width direction of the printed layer, as in the third to sixth modes described below. That is, a part of the adhered member may be formed so as to lie outside the printed layer when observed from the antifouling-layer side. In FIG. 9 is illustrated a top view of a cover member 310 according to a third mode observed from the antifouling-layer side. In FIG. 10 is illustrated an enlarged view of the periphery of an adhered member 304 of the cover member 310 according to the third mode, when observed from the printed-layer side. Dotted lines X1, X2, Y1, Y2, Z1, and Z2 indicated in FIG. 10 are the same as in the second mode illustrated in FIG. 8.

The third mode is an example in which a part of the adhered member 304 lies outside a cover-member-inside-direction end of the printed layer 303 when observed from the antifouling-layer side. The third mode is also an example in which the adhered member has a ring shape when observed from the antifouling-layer side of the cover member. In the case where the adhered member has a ring shape, at least a part of the inner region preferably includes a portion equipped with no printed layer continuous along a circumferential direction of the ring, as illustrated in FIG. 10.

As a cover member 410 according to a fourth mode, an example is explained in which a part of an adhered member 404 lies outside the cover member when observed from the antifouling-layer side.

In FIG. 11 is illustrated a top view of the cover member 410 according to the fourth mode observed from the antifouling-layer side. In FIG. 12 is illustrated an enlarged view of the periphery of the adhered member 404 in a cross-sectional view taken on the line D-D of FIG. 11. In FIG. 13 is illustrated an enlarged view of the periphery of the adhered member 404 of the cover member 410 according to the fourth mode, when observed from the printed-layer side.

Dotted lines X1, X2, Y1, Y2, Z1, and Z2 indicated in FIG. 13 are the same as in the second mode illustrated in FIG. 8.

In a second main surface 401B of a transparent base 401, an inward portion lies at 50 μm from a peripheral edge thereof is indicated by dotted line W. In the second main surface 401B, a region ranging from the peripheral edge to the inward portion (i.e., the portion indicated by the line W) at 50 μm from the peripheral edge is defined as a near-peripheral-edge region.

In the case where a part of the adhered member 404 lies outside the cover member when observed from the antifouling-layer side, as in the fourth mode, there are cases where the near-peripheral-edge region overlies at least a part of the inner region. This overlap portion suffers especially high stress when a load is imposed on the adhered member. Consequently, this overlap portion is preferably equipped with no printed layer. That is, in the case where a part of the inner region is included in the near-peripheral-edge region, the portion of the inner region included in the near-peripheral-edge region is preferably equipped with no printed layer.

More preferably, a portion of the second main surface 401B where a region ranging from the peripheral edge to an inward portion at 100 μm from the peripheral edge overlies the inner region is equipped with no printed layer. Still more preferably, a portion of the second main surface 401B where a region ranging from the peripheral edge to an inward portion at 200 μm from the peripheral edge overlies the inner region is equipped with no printed layer. Especially preferably, a portion of the second main surface 401B where a region ranging from the peripheral edge to an inward portion at 500 μm from the peripheral edge overlies the inner region is equipped with no printed layer. Most preferably, a portion of the second main surface 401B where a region ranging from the peripheral edge to an inward portion at 1,000 μm from the peripheral edge overlies the inner region is equipped with no printed layer.

Moreover, a portion where the near-peripheral-edge region overlies the near-boundary region is especially preferably equipped with no printed layer. This configuration can more reliably reduce the stress which is to occur in the peripheral edge of the printed layer.

As a cover member 510 according to a fifth mode, explained is a preferred example in a configuration in which a printed layer is formed in a zonal manner along an edge of a transparent base and an adhered-member-contact-portion projected region includes one end and another end in the width direction of the printed layer.

In FIG. 14 is illustrated a top view of the cover member 510 according to the fifth mode observed from the antifouling-layer side. In FIG. 15 is illustrated an enlarged view of the periphery of an adhered member 504 in a cross-sectional view taken on the line E-E of FIG. 14. In FIG. 16 is illustrated an enlarged view of the periphery of the adhered member 504 of the cover member 510 according to the fifth mode, when observed from the printed-layer side.

Dotted lines X, Y, and Z indicated in FIG. 16 are the same as in the first mode illustrated in FIG. 5.

In this configuration, a continuous portion equipped with no printed layer is preferably present between the one end and the another end in the width direction of the printed layer included in the adhered-member-contact-portion projected region, as illustrated in FIG. 16. That is, the adhered-member-contact-portion projected region preferably has a continuous portion equipped with no printed layer, between the one end and the another end in the width direction of the printed layer. By forming such a portion equipped with no printed layer, the printed layer is made discontinuous in the length direction (direction perpendicular to the width direction). Thus, the stress which the printed layer may suffer can be reduced.

As the fifth mode, an example is described above, in which the adhered member has a circular shape when observed from the antifouling-layer side of the cover member. However, the explanation given above applies also in the case where the adhered member has a ring shape. As a sixth mode, an example is explained, which has a configuration in which an adhered-member-contact-portion projected region includes one end and another end in the width direction of a printed layer and in which the adhered member has a ring shape.

In FIG. 17 is illustrated a top view of a cover member 610 according to the sixth mode observed from the antifouling-layer side. In FIG. 18 is illustrated an enlarged view of the periphery of an adhered member 604 in a cross-sectional view taken on the line F-F of FIG. 17. In FIG. 19 is illustrated an enlarged view of the periphery of the adhered member 604 of the cover member 610 according to the sixth mode, when observed from the printed-layer side.

Dotted lines X1, X2, Y1, Y2, Z1, and Z2 indicated in FIG. 19 are the same as in the second mode illustrated in FIG. 8. Dotted line W is the same as in the fourth mode illustrated in FIG. 13.

In this example also, a continuous portion equipped with no printed layer is preferably present between the one end and the another end in the width direction of the printed layer included in the adhered-member-contact-portion projected region, as in the fifth mode. Furthermore, a portion where the near-peripheral-edge region overlies the inner region is preferably equipped with no printed layer, as explained above with regard to the fourth mode.

Although the cover member of this embodiment was explained above by referring to a plurality of examples thereof, this cover member is not limited to these examples. For example, although the adhered members explained in the examples given above each had a circular or doughnut shape, the adhered members may have other shapes. The cover members employing other suitable modifications within the gist of the present invention are also included in the scope of the present invention.

Second Embodiment

Cover Member

A cover member according to a second embodiment includes a transparent base, an antifouling layer, and a printed layer. The transparent base has a first main surface and a second main surface. The antifouling layer is formed on or above at least a part of the first main surface of the transparent base. The printed layer is formed on or above at least a part of the second main surface of the transparent base.

The cover member according to this embodiment is used after an adhered member is adhered to a surface on an antifouling layer-side. That is, the cover member according to this embodiment is a cover member in such a stage that an adhered member has not been provided thereto.

Preferred configurations of the transparent base, antifouling layer, printed layer, and adhered member, which is to be provided later, and of an close-contact layer and a low-reflection layer, which are optional constituent elements, are the same as in the first embodiment.

The cover member according to the second embodiment partly has a portion equipped with no printed layer, like the cover member according to the first embodiment. In the first embodiment, preferred modes of the portion equipped with no printed layer are specified by using positional relationships with the adhered member. In the second embodiment, however, since the cover member includes no adhered member, preferred modes of the portion equipped with no printed member are specified in a manner different from that used for the first embodiment.

Detailed explanations are given below.

In the second embodiment, the first main surface of the transparent base has a region where substantially no antifouling layer is present. The expression "substantially no antifouling layer is present" has the same meaning as in the first embodiment. A part or the entirety of this region where substantially no antifouling layer is present later becomes an adhered portion to which an adhered member is provided. Hence, in the second embodiment, positional relationships with this region where substantially no antifouling layer is present are used to specify preferred modes of the portion equipped with no printed layer.

In the second embodiment, a region formed by projecting the region in the first main surface of the transparent base where substantially no antifouling layer is present, parallel with the thickness direction of the transparent base on the second main surface is defined as an antifouling-layer-absent-portion projected region. This definition is the same as in first embodiment.

Furthermore, in the second embodiment, in the antifouling-layer-absent-portion projected region, a region lying 500 μm or more inside form the boundary of the region is defined as an inner region.

In the second embodiment, at least a part of the inner region is made to be equipped with no printed layer.

In the second embodiment, the region where substantially no antifouling layer is present and the region to which an adhered member is to be provided later approximately coincide with each other. Because of this, the antifouling-layer-absent-portion projected region in the second embodiment is a portion in which high stress can be incurred locally when, after an adhered member has been provided thereto, a load is imposed on the adhered member. Consequently, in the second embodiment, by making at least a part of the inner region be equipped with no printed layer, the printed layer is rendered less apt to crack or break after an adhered member is provided later, as in the first embodiment.

The shape of the adhered member-absent-portion projected region, that is, the shape of the region in the first main surface where substantially no antifouling layer is present, may be suitably set in accordance with the shape of the adhered member. For example, the shape thereof is a circular, elliptic, quadrilateral, ring shape, or the like.

As in the first embodiment, at least a part of the antifouling-layer-absent-portion projected region is preferably equipped with no printed layer. More preferably, the entirety of the antifouling-layer-absent-portion projected region is equipped with no printed layer.

In the case where the adhered member-absent-portion projected region has a ring shape, a portion equipped with no printed layer continuous along a circumferential direction of the ring is preferably provided to at least a part of the inner region.

In the second embodiment, in the case where a part of the near-peripheral-edge region overlies at least a part of the antifouling-layer-absent-portion projected region, this overlap portion is preferably equipped with no printed layer. That is, in the case where a part of the antifouling-layer-absent-portion projected region is included in the near-peripheral-edge region, the portion of the antifouling-layer-absent-portion projected region included in the near-peripheral-edge region is preferably equipped with no printed layer. On the second main surface, a portion where a region ranging from the peripheral edge to an inward portion at 100 μm from the peripheral edge overlies the antifouling-layer-absent-portion projected region is more preferably equipped with no printed layer. Still more preferably, a portion where a region ranging from the peripheral edge to an inward portion at 200 µm from the peripheral edge overlies the antifouling-layer-absent-portion projected region is equipped with no printed layer. Especially preferably, a portion where a region ranging from the peripheral edge to an inward portion at 500 µm from the peripheral edge overlies the antifouling-layer-absent-portion projected region is equipped with no printed layer. Most preferably, a portion where a region ranging from the peripheral edge to an inward portion at 1,000 µm from the peripheral edge overlies the antifouling-layer-absent-portion projected region is equipped with no printed layer.

Furthermore, as in the first embodiment, in the case where a printed layer is formed in a zonal manner along an edge of a transparent base and an antifouling-layer-absent-portion projected region includes one end and another end in the width direction of the printed layer, then a continuous portion equipped with no printed layer is preferably present between the one end and the another end in the width direction of the printed layer included in the antifouling-layer-absent-portion projected region.

EXAMPLES

The present invention is explained in detail below by referring to Examples, but the present invention is not limited to the following Examples unless departing from the spirit thereof. Examples 1 to 3 are inventive examples and Example 4 is a comparative example.

Example 1

Formation of Printed Layer

On a second main surface of a glass base (Dragontrail, manufactured by AGC Inc.) of 250 mm×350 mm×1.3 mm, a printed layer was formed on a region ranging from the edges of the second main surface to an inward at 50 mm from the edges. However, the printed layer was not formed in a whole region in the second main surface which ranged from the boundaries of an adhered-member-contact-portion projected region, which will be described later, to an inward at 1,000 µm from each boundary.

A black printed layer was formed by performing printing by screen printing in the following manner. First, by using a screen printer, a black ink (trade name GLS-HF, manufactured by Teikoku Ink Mfg. Co., Ltd.) was applied in a thickness of 3 µm. Thereafter, the resultant was held at 150° C. for 10 minutes to dry, thereby forming a first printed layer. Subsequently, the same black ink was applied in a thickness of 3 µm on the first printed layer in the same manner as described above. Thereafter, the resultant was held at 150° C. for 40 minutes to dry, thereby forming a second printed layer. Thus, a black printed layer composed of the first printed layer and the second printed layer superposed thereon was formed to obtain a glass base equipped with the printed layer formed in the peripheral portion of the second main surface.

Formation of Close-Contact Layer

An $SiO_2$ film was formed as a close-contact layer on a first main surface of the glass base. The $SiO_2$ film was deposited in an $Ar/O_2$ atmosphere by magnetron sputtering using an Si target. The film thickness was 10 nm.

Formation of Antifouling Layer

Next, an antifouling layer was formed above the first main surface. First, as a material for the antifouling layer, a material for forming a fluorinated-organosilicon-compound coating film was introduced into a heating vessel. Thereafter, the heating vessel was evacuated with a vacuum pump for 10 hours or longer to remove the solvent from the material solution to convert into a composition for forming a fluorinated-organosilicon-compound coating film (hereinafter referred to as "composition for coating film formation"). As the composition for coating film formation, KY-185 (manufactured by Shin-Etsu Chemical Co., Ltd.) was used.

Subsequently, the heating vessel containing the composition for coating film formation was heated to 270° C. After the temperature had reached 270° C., the heated state was maintained for 10 minutes until the temperature became stable. Next, the glass base on which the printed layer and the close-contact layer had been formed was placed in a vacuum chamber. Thereafter, the composition for coating film formation was fed toward the first main surface of the glass base through a nozzle connected to the heating vessel containing the composition for coating film formation, thereby conducting film deposition.

The film deposition was conducted while measuring the film thickness with a quartz oscillator monitor installed in the vacuum chamber, until the film thickness of the fluorinated-organosilicon-compound coating film formed on the close-contact layer, reached 4 nm. Thereafter, the glass base was taken out of the vacuum chamber.

Bonding of Adhered Member

Subsequently, a doughnut-shaped adhered member (outer diameter: 70 mm; inner diameter: 40 mm; material: ABS resin) was bonded to the first main surface so that the right-hand edge of the adhered member positioned at 20 mm inside from the right-hand edge of the first main surface of the glass base, thereby obtaining a cover member of Example 1. HAMATITE SS-310 (manufactured by The Yokohama Rubber Co., Ltd.) was used as an adhesive, and the adherend was kept fixed at room temperature for 20 hours to bond. Before the adhered member was bonded, the antifouling layer was removed under the following conditions from the entirety of a region in the first main surface in a position where the adhered member was to be attached and 500 µm or more inside from the boundaries of the adhered member.

Conditions for Removing Antifouling Layer

Mask used: A glass mask having a thickness of 0.7 mm in which a hole having the shape of the region where the antifouling layer was to be removed was superposed on the first main surface, and the following atmospheric plasma treatment was performed. A circular glass mask, prepared separately from the above-described glass mask, was placed on the center portion of the doughnut-shaped region where the antifouling layer was not to be removed. The material of the masks is not limited to glass, and use can be made of any thin plate having heat resistance, such as alumina or Bakelite.

Device used: plasma irradiator PS-1200AW, manufactured by WEDGE Co., Ltd.

Gas used: Air
Frequency: 50 Hx
Output: 1,200 W
Head speed, number of treatments: 20 mm/sec×four reciprocating movements
Distance between glass and plasma irradiation aperture: 5 mm Evaluation of Surface F Amount In the region where the antifouling layer had been removed, that is, the region which had undergone the atmospheric plasma treatment using the glass masks, an inner region excluding a 1.5-mm peripheral portion was examined for surface F amount. The region where the antifouling layer remained unremoved had an F amount (F-count) of 0.193 kcps. In contrast, the inner region excluding a 1.5-mm peripheral portion, in the region where the antifouling layer had been removed, had an F amount (F-count) of 0.120 kcps or less. This value was 62% or less of the F amount of the region where the antifouling layer remained unremoved, which was taken as 100%.

Conditions for the examination with a μ-X-ray photoelectron spectroscope were as follows.

Examination device: scanning μ-X-ray photoelectron spectroscope Quantra SXM, manufactured by Ulvac-Phi Inc.

X-ray source: 100 μm of Al Kα, 25 W, 15 kV

Examination conditions: Pass energy=224 [eV], Energy step=0.4 [eV/step], 1 cycle Examination angle: 45° point examination Evaluation of Adhesion Strength Next, the adhered member was evaluated for adhesion strength under the following conditions. In evaluating the adhered member of each Example for adhesion strength, a sample, which had been produced by bonding an adhered member in the same manner as described above except that the antifouling layer was not removed, was separately produced and evaluated for comparison.

Evaluation device: PosiTest AT-A (manufactured by DeFelsko Corp.)

Jig: made of aluminum metal, 20 mmφ

Primer for jig: HAMATITE PRIMER No. 70, manufactured by The Yokohama Rubber Co., Ltd.

Pulling speed: 0.2 MPa/sec

As a result of the adhesion strength evaluation, the sample obtained by bonding the adhered member without removing the antifouling layer had an adhesion strength of about 0.75 MPa. Meanwhile, the cover member of Example 1, in which the antifouling layer had been removed under the removal conditions described above, had an adhesion strength of about 1.00 MPa, showing that the adhesion strength was excellent.

In FIG. 20 is illustrated a diagrammatic view of the cover member of Example 1 observed from the printed-layer side. Dotted lines X1 and X2 in FIG. 20 indicate the boundaries of the adhered-member-contact-portion projected region.

Example 2

A cover member of Example 2 was obtained in the same manner as in Example 1, except that a printed layer was formed on a region ranging from the edges of the second main surface to an inward at 25 mm from the edges and that an adhered member was bonded so that the right-hand edge of the adhered member positioned at 5 mm outside from the right-hand edge of the first main surface of the glass base.

The inner region excluding a 1.5-mm peripheral portion, in the region where the antifouling layer had been removed, had an F amount (F-count) of 0.12 kcps or less. This value was 62% or less of the F amount in the region where the antifouling layer remained unremoved, which was taken as 100%.

The adhered member had an adhesion strength of about 1.00 MPa, showing that the adhesion strength was excellent.

In FIG. 21 is illustrated a diagrammatic view of the cover member of Example 2 observed from the printed-layer side. Dotted lines X1 and X2 in FIG. 21 indicate the boundaries of the adhered-member-contact-portion projected region.

Example 3

A printed layer was formed on the second main surface of the same glass base as in Example 1, over a region ranging from the edges of the second main surface to an inward at 25 mm from the edges, and an antifouling layer was formed on the first main surface. In forming the printed layer, a continuous portion equipped with no printed layer was formed between one end and another end in the width direction of the printed layer, as illustrated in FIG. 22. The portion equipped with no printed layer had a width of 5 mm and was placed so that the width-direction center line of this portion passed through the center of the adhered-member-contact-portion projected region which will be described later. Subsequently, a disk-shaped adhered member (outer diameter, 40 mm) was bonded so that the right-hand edge of the adhered member positioned at 5 mm outside from the right-hand edge of the first main surface of the glass base, thereby obtaining a cover member of Example 3. Before the disk-shaped adhered member was thus bonded, the antifouling layer was removed from the entirety of a rectangular region which was inscribed in a region (circular region) to be substantially in contact with the adhered member and one side of which coincided with a peripheral edge of the glass base. Thus, the cover member of Example 3 was obtained. The conditions for forming the printed layer, forming the antifouling layer, bonding the adhered member, and the like, other than those described above, were the same as in Example 1.

The inner region excluding a 1.5-mm peripheral portion, in the region where the antifouling layer had been removed, had an F amount (F-count) of 0.12 kcps or less. This value was 62% or less of the F amount in the region where the antifouling layer remained unremoved, which was taken as 100%.

The adhered member had an adhesion strength of about 1.00 MPa, showing that the adhesion strength was excellent.

In FIG. 22 is illustrated a diagrammatic view of the cover member of Example 3 observed from the printed-layer side. Dotted line X in FIG. 22 indicates the boundary of the adhered-member-contact-portion projected region.

Example 4

A printed layer was formed on the second main surface of the same glass base as in Example 1, over a region ranging from the edges of the second main surface to an inward at 40 mm from the edges, and an antifouling layer was formed on the first main surface. Subsequently, a disk-shaped adhered member (outer diameter, 30 mm) was bonded so that the right-hand edge of the adhered member positioned at 5 mm inside from the right-hand edge of the first main surface of the glass base, thereby obtaining a cover member of Example 4. Before the disk-shaped adhered member was thus bonded, the antifouling layer was removed from the entirety of a region in the first main surface in a position where the adhered member was to be attached and 500 µm or more inside from the boundary of the adhered member. Thus, the cover member of Example 4 was obtained. The conditions for forming the printed layer, forming the antifouling layer, bonding the adhered member, or the like, other than those described above, were the same as in Example 1.

The inner region excluding a 1.5-mm peripheral portion, in the region where the antifouling layer had been removed, had an F amount (F-count) of 0.12 kcps or less. This value was 62% or less of the F amount in the region where the antifouling layer remained unremoved, which was taken as 100%.

The adhered member had an adhesion strength of about 1.00 MPa, showing that the adhesion strength was excellent.

In FIG. 23 is illustrated a diagrammatic view of the cover member of Example 4 observed from the printed-layer side. Dotted line X in FIG. 23 indicates the boundary of the adhered-member-contact-portion projected region.

Evaluation

The cover members of the Examples were each subjected to the following operations (1) to (4).

(1) The cover member was placed vertically, and a 5-kg weight was hung on the adhered member and held for 1 minute. Thereafter, the cover member was rotated so as to be vertically reversed, with the weight being kept hung, and was then held for further 1 minute. This operation was repeatedly performed 50 times in total.

(2) The cover member was placed horizontally so that the adhered member faced upward. A 5-kg weight was placed on the adhered member and held for 1 minute. Thereafter, the weight was removed, and the cover member was held for 1 minute. This operation was repeatedly performed 50 times in total.

(3) A heat cycle test was conducted. The heat cycle test was performed by repeatedly conducting, 100 times, a cycle consisting of placing the cover member in a −40° C. environment for 30 minutes and subsequently placing the cover member in an 85° C. environment for 30 minutes.

(4) The cover member was introduced into a wet-heat tester and held for 100 hours in an environment of 70° C. and 95% RH.

Thereafter, the cover member was immersed in an NaOH solution (pH=11) for 2 hours. In the case where the printed layer has cracked, the NaOH solution penetrates through the cracks to dissolve the glass. Hence, cracks of the printed layer are easily recognized visually.

Thereafter, the cover member was observed visually and with a microscope (50 diameters) from the printed-layer side to assess whether lifting of the printed layer was able to be ascertained, and evaluated in accordance with the following criteria.

A: Lifting of the printed layer cannot be ascertained either visually or by the observation with the microscope.

B: Lifting of the printed layer cannot be visually ascertained but can be ascertained by the observation with the microscope.

C: Lifting of the printed layer can be visually ascertained.

In the cover member of Example 4, which is a comparative example, lifting of the printed layer was visually ascertained (rating C).

In the cover member of Example 3, which is an inventive example, the printed layer had high durability. Lifting of the printed layer was not ascertained visually, but ascertained with the microscope (rating B).

In the cover members of Example 1 and Example 2, which are inventive examples, the printed layers had particularly high durability and lifting of the printed layer was not ascertained either visually or with the microscope (rating A).

Furthermore, even when the adhered members in Examples 1 to 3 were each observed from an oblique direction, the edge of the printed layer was less apt to be visually recognized. These cover members hence had excellent appearance attractiveness.

While the present invention has been described in detail and with reference to specific embodiments thereof, it will be apparent to one skilled in the art that various changes and modifications can be made therein without departing from the spirit and scope thereof. This application is based on a Japanese patent application filed on Aug. 26, 2019 (Application No. 2019-154124), the contents thereof being incorporated herein by reference.

REFERENCE SIGNS LIST 10, 110, 210, 310, 410, 510, 610 Cover member
1, 101, 201, 401, 501, 601 Transparent base
1A, 101A, 201A, 401A, 501A, 601A First main surface of transparent base
1B, 101B, 201B, 401B, 501B, 601B Second main surface of transparent base
2, 102, 202, 402, 502, 602 Antifouling layer
3, 103, 203, 303, 403, 503, 603 Printed layer
4, 104, 204, 304, 404, 504, 604 Adhered member
X, X1, X2 Boundary of adhered-member-contact-portion projected region
Y, Y1, Y2 Inward portion at 1,000 µm from boundary of adhered-member-contact-portion projected region
Z, Z1, Z2 Inward portion at 500 µm from boundary of adhered-member-contact-portion projected region
W Inward portion at 500 µm from peripheral edge of transparent base

The invention claimed is:

1. A cover member comprising a transparent base, an antifouling layer, a printed layer, and an adhered member,
wherein the transparent base has a first main surface and a second main surface,
the antifouling layer is formed on or above at least a part of the first main surface,
the printed layer is formed on or above at least a part of the second main surface, and
the adhered member is adhered on a surface on an antifouling layer-side, and
wherein when an adhered-member-contact-portion projected region is defined as a region in the second main surface to which a region where the adhered member is substantially in contact with the transparent base or with the antifouling layer is projected parallel with a thickness direction of the transparent base,
when a near-boundary region is defined as a region in the adhered-member-contact-portion projected region, ranging from a boundary of the region to an inward portion at 1,000 µm from the boundary of the region, and when an inner region is defined as a region in the adhered-member-contact-portion projected region, lying 500 μm or more inside from the boundary of the region, then the printed layer is provided on at least a part of the near-boundary region, and no printed layer is provided on at least a part of the inner region.

2. The cover member according to claim 1, wherein the first main surface of the transparent base includes a region where substantially no antifouling layer is present, in the region where the adhered member is substantially in contact with the transparent base or with the antifouling layer, and wherein when an antifouling-layer-absent-portion projected region is defined as a region in the second main surface to which the region where substantially no antifouling layer is present is projected parallel with the thickness direction of the transparent base, then the inner region includes at least a part of the antifouling-layer-absent-portion projected region, and no printed layer is provided on the portion of the antifouling-layer-absent-portion projected region included in the inner region.

3. The cover member according to claim 2, wherein the inner region includes the entirety of the antifouling-layer-absent-portion projected region.

4. The cover member according to claim 1, wherein the adhered member has a ring shape and at least a part of the inner region includes a portion equipped with no printed layer continuous along a circumferential direction of the ring.

5. The cover member according to claim 1, wherein the printed layer is formed in a zonal manner along an edge of the transparent base, the adhered-member-contact-portion projected region includes one end and another end in a width direction of the printed layer, and the adhered-member-contact-portion projected region includes a continuous portion equipped with no printed layer, between the one end and the another end in the width direction of the printed layer.

6. The cover member according to claim 1, wherein when a near-peripheral-edge region is defined as a region in the second main surface, ranging from a peripheral edge thereof to an inward portion at 50 μm from the peripheral edge, then the near-peripheral-edge region includes a part of the inner region, and no printed layer is provided on the portion of the inner region included in the near-peripheral-edge region.

7. The cover member according to claim 1, wherein the transparent base is a glass base.

8. The cover member according to claim 7, wherein the glass base is a chemically strengthened glass base.

9. The cover member according to claim 1, further comprising a close-contact layer between the first main surface of the transparent base and the antifouling layer.

10. A cover member comprising a transparent base, an antifouling layer, and a printed layer, wherein the transparent base has a first main surface and a second main surface, the antifouling layer is formed on or above at least a part of the first main surface, the printed layer is formed on or above at least a part of the second main surface, the first main surface includes a region where substantially no antifouling layer is present, and wherein when an antifouling-layer-absent-portion projected region is defined as a region in the second main surface to which the region where substantially no antifouling layer is present is projected parallel with a thickness direction of the transparent base, and when an inner region is defined as a region in the antifouling-layer-absent-portion projected region, lying 500 μm or more inside from a boundary of the region, then no printed layer is provided on at least a part of the inner region.

11. The cover member according to claim 10, wherein the antifouling-layer-absent-portion projected region has a ring shape.

12. The cover member according to claim 10, wherein when a near-peripheral-edge region is defined as a region in the second main surface, ranging from a peripheral edge thereof to an inward portion at 50 μm from the peripheral edge, then the near-peripheral-edge region includes a part of the antifouling-layer-absent-portion projected region, and no printed layer is provided on the portion of the antifouling-layer-absent-portion projected region included in the near-peripheral-edge region.

13. The cover member according to claim 10, wherein no printed layer is provided over the entirety of the antifouling-layer-absent-portion projected region.

14. The cover member according to claim 10, wherein the printed layer is formed in a zonal manner along an edge of the transparent base, the antifouling-layer-absent-portion projected region includes one end and another end in a width direction of the printed layer, and the antifouling-layer-absent-portion projected region includes a continuous portion equipped with no printed layer, between the one end and the another end in the width direction of the printed layer.

15. The cover member according to claim 10, wherein the transparent base is a glass base.

16. The cover member according to claim 15, wherein the glass base is a chemically strengthened glass base.

17. The cover member according to claim 10, further comprising a close-contact layer between the first main surface of the transparent base and the antifouling layer.

* * * * *